(12) United States Patent
Grabinger et al.

(10) Patent No.: US 6,504,726 B1
(45) Date of Patent: Jan. 7, 2003

(54) TELECOMMUNICATIONS PATCH PANEL

(75) Inventors: Cory Lee Grabinger, Maple Grove; Chansy Phommachanh, Shakopee, both of MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 09/991,260

(22) Filed: Nov. 16, 2001

(51) Int. Cl.[7] .................................................. H05K 7/14
(52) U.S. Cl. ................. 361/796; 373/413.04; 439/76.1; 439/540.1; 439/638
(58) Field of Search ................................ 361/752, 753, 361/796, 797, 825; 379/413.04, 438; 439/941, 76.1, 676, 540.1, 638

(56) References Cited

U.S. PATENT DOCUMENTS

| | | | |
|---|---|---|---|
| 5,269,708 A | * 12/1993 | DeYoung et al. | 439/676 |
| 5,639,261 A | * 6/1997 | Rutkowski et al. | 439/31 |
| 5,721,776 A | * 2/1998 | McLean et al. | 379/435 |
| 6,123,577 A | * 9/2000 | Contois et al. | 439/535 |
| 6,168,474 B1 | * 1/2001 | German et al. | 439/620 |
| 6,296,534 B1 | * 10/2001 | Li-Ming | 174/263 |
| 6,319,066 B2 | * 11/2001 | Kuo | 439/638 |

* cited by examiner

Primary Examiner—David Martin
Assistant Examiner—Thanh S. Phan
(74) Attorney, Agent, or Firm—Merchant & Gould P.C.

(57) ABSTRACT

A telecommunications module with a circuit board including pairs of connectors mounting on both sides of the circuit board held within a housing by structure that holds the circuit board offset from the front and rear of the module and connectors accessible openings in the rear wall of the module. A telecommunications patch panel including one or more modules mounted to the rear of a faceplate, each module with a circuit board including pairs of electrically linked connectors mounting on both sides of the circuit board held within the module by structure that holds the circuit board offset from the front and rear of the module with connectors accessible through a rear wall of the module and through the faceplate. A method of assembling a telecommunications module and a method of assembling a telecommunications patch panel including one or more modules attached to the rear of a faceplate. A circuit board for mounting pairs of telecommunications connectors on opposite sides, the circuit board including circuits connecting the mounting locations, each circuit paired with and laid adjacent to another circuit and all the circuits positioned on a single layer of the circuit board without crossing another circuit. A circuit board for mounting pairs of telecommunications connectors on opposite sides, the circuit board including circuits connecting the mounting locations, each circuit paired with and laid adjacent to another circuit and at least one pair of circuits lying on a separate layer of the circuit board from the other pairs.

26 Claims, 27 Drawing Sheets

TELECOMMUNICATIONS PATCH PANEL

FIELD OF THE INVENTION

The present invention relates to a telecommunications connection panel. More particularly, the present invention relates to a telecommunications cross-connection patch panel with connectors on both sides of the panel.

BACKGROUND OF THE INVENTION

Local area networks and telecommunications connections often use patch panels, especially at customers premises to enable quick and convenient cross-connection between telecommunications equipment. Twisted pair communications cable is often used to link telecommunications devices to these patch panels, with each cable including four twisted pairs or eight total individual wires.

Front connectors on these patch panels typically have jacks to receive plug-type connectors, such as RJ-45 connectors. Such front connectors allow for easy connection and disconnection between telecommunications equipment electronically connected to the same patch panel or to patch panels located in relatively close proximity to one another. These front connectors are mounted to a circuit board within the panel and accessed through a faceplate of the panel. These connectors are typically mounted so that the outermost surface of the connector is flush with the faceplate and the remainder of the connector and the circuit board is housed within the panel. The circuit boards are mounted to the rear of the faceplate with screws and stand-offs to provide the offset spacing so that the connector is properly positioned relative to the faceplate. Patch panels assembled in this fashion include a high part count, are expensive to manufacture and are difficult to service. Improvements to the mounting and positioning of front connectors in telecommunications patch panels are desirable.

Often, the rear connectors on a patch panel are more permanent types of connectors, such as insulation displacement connectors or wire wrap connectors. These types of connectors are suitable for this type of connection. However, the quality of the electrical connection made with such a connector can vary with the skill level of the person assembling the panel and the environment in which the panel is mounted. Improvement to the rear connectors of telecommunication patch panels is desirable.

The front and rear connectors within a patch panel are paired up, with each front connector being electrically linked to a rear connector. The connectors are often mounted to opposite sides of a circuit board, with circuit traces on the circuit board providing the electronic connection between the paired front and rear connectors. According to industry standards, the wires within each twisted pair cable are color-coded and linked to spring contacts within the connectors in a specified order. The connectors include pins extending from the connectors and electrically linked with the spring contacts to electrically connect the wires in the cables to the circuits on the circuit board. As higher frequencies are used for transmission of electronic information through the circuitry, cross-talk becomes a more substantial problem to the performance of the patch panel. Improvements to current circuit board design to reduce cross talk are desirable.

SUMMARY OF THE INVENTION

The present invention relates to a telecommunications module with a circuit board including pairs of connectors mounted on opposing sides of the circuit board, the circuit board held within a housing by structure that holds the circuit board offset from the rear of the module and a connector accessible through an opening in a rear wall of the module. Another aspect of the present invention relates to a telecommunications patch panel including one or more modules mounted to the rear of a faceplate, each module with a circuit board including pairs of electrically linked connectors mounted on opposing sides of the circuit board, the circuit board held within the module by structure that holds the circuit board offset from the front and rear of the module with connectors accessible through a rear wall of the module and through the faceplate.

A further aspect of the present invention relates to a method of assembling a telecommunications module including a circuit board and a structure for mounting the circuit board with the module so that connectors mounted to the circuit board are accessible through an opening in the rear wall of the module. Another aspect of the present invention relates to a method of assembling a telecommunications patch panel including one or more modules attached to the rear of a faceplate.

The present invention also relates to a circuit board for mounting pairs of telecommunications connectors on opposite sides, the circuit board including circuit paths connecting the mounting locations, each circuit path paired with and laid adjacent to another circuit path and each of the circuit paths positioned on the circuit board without crossing another circuit path. A further aspect of the present invention relates to a circuit board for mounting pairs of telecommunications connectors on opposite sides, the circuit board including circuit paths connecting the mounting locations, each circuit path paired with and positioned adjacent to another circuit path and at least one pair of circuit paths lying on a separate layer of the circuit board from the other pairs.

BRIEF DESCRIPTION OF THE DRAWINGS

The accompanying drawings, which are incorporated in and constitute a part of the description, illustrate several aspects of the present invention and together with the description, serve to explain several aspects of the invention. A brief description of the drawings is as follows.

DETAILED DESCRIPTION OF THE PREFERRED EMBODIMENTS

Figure 1:
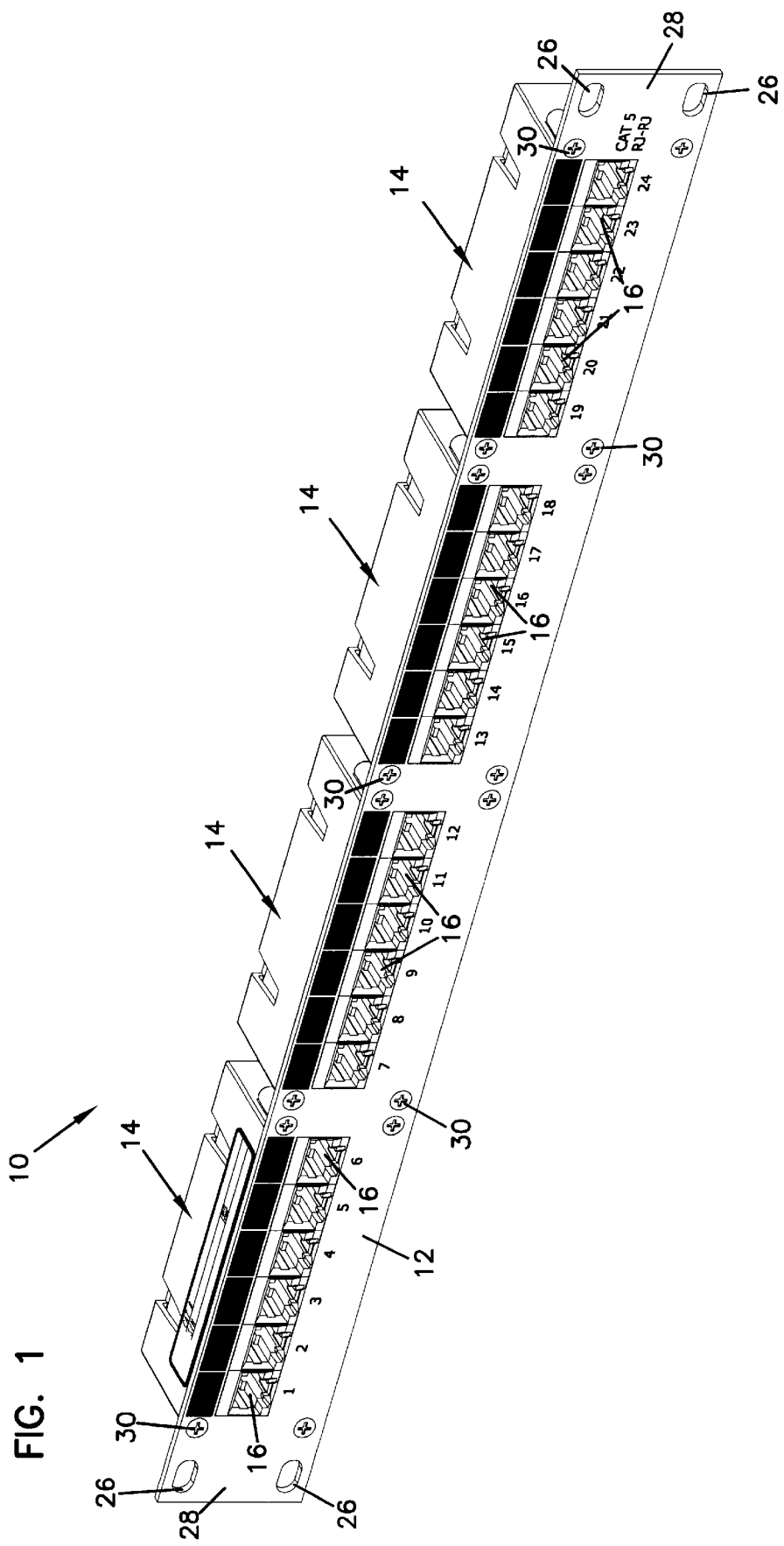
FIG. 1 is a front perspective view of a telecommunications patch panel according to the present invention.
Figure 2:
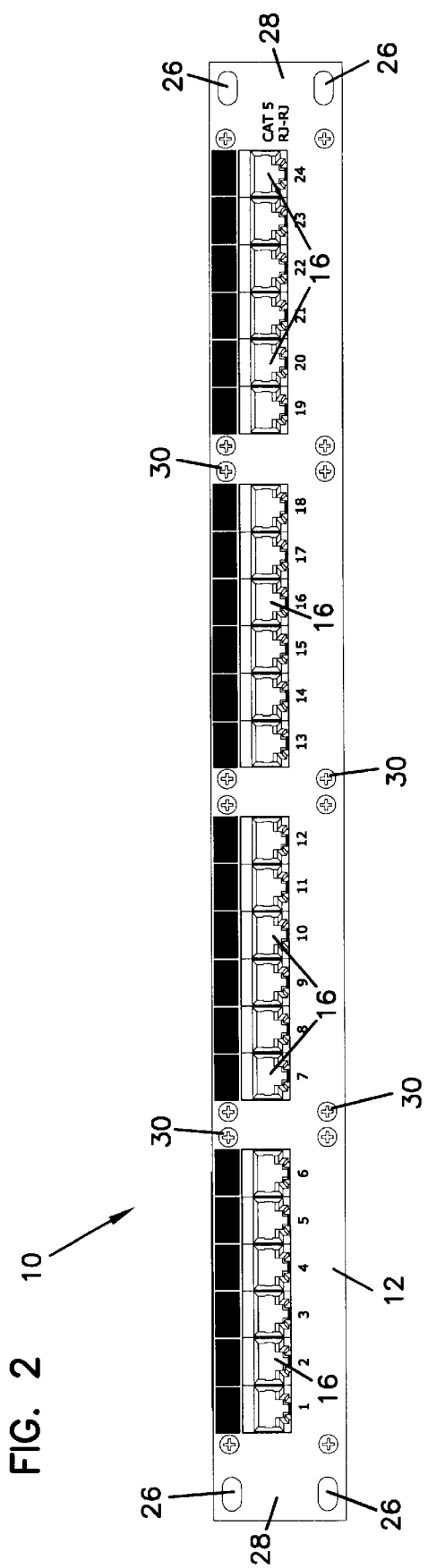
FIG. 2 is a front view of the telecommunications patch panel of FIG. 1.
Figure 3:
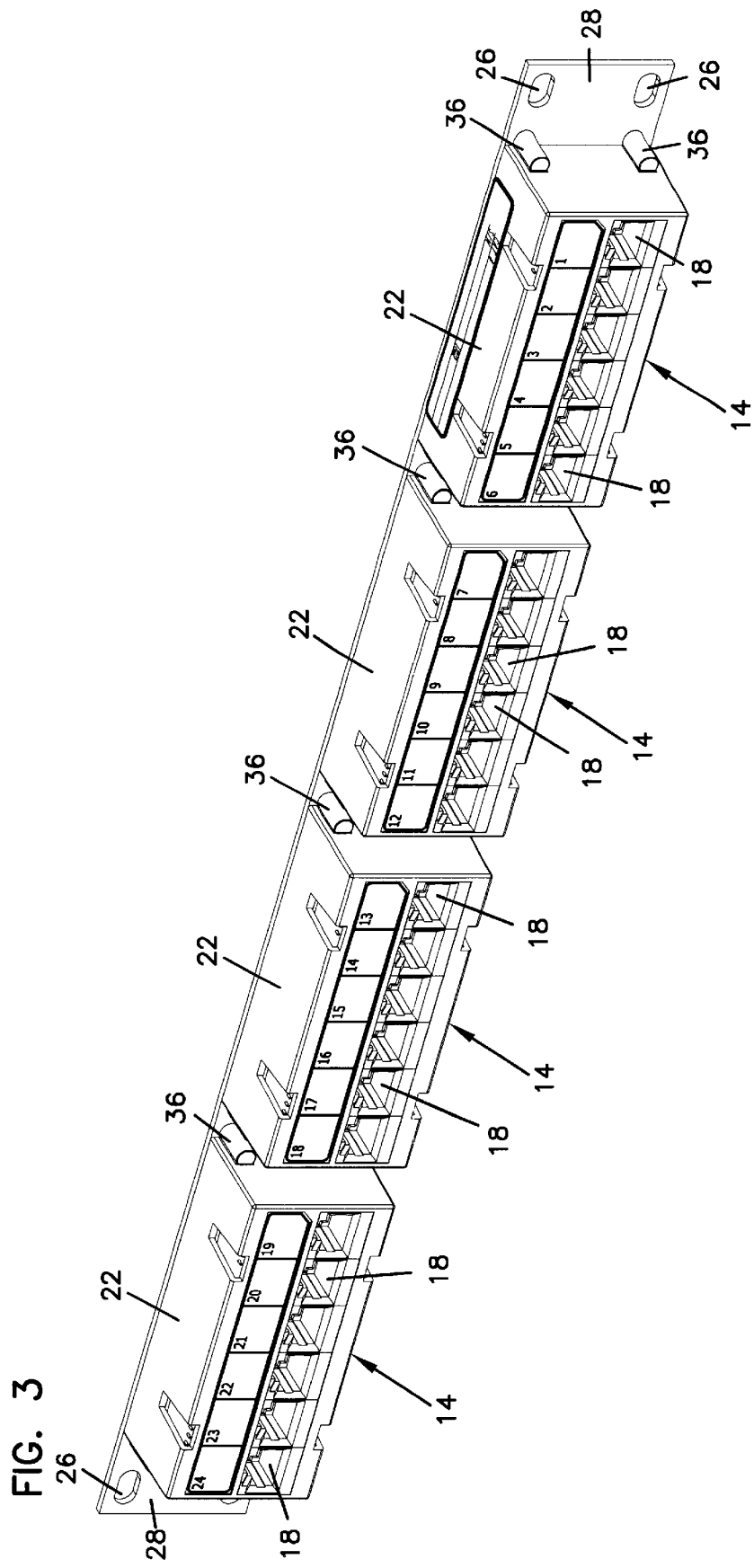
FIG. 3 is a rear perspective view of the telecommunications patch panel of FIG. 1.
Figure 4:
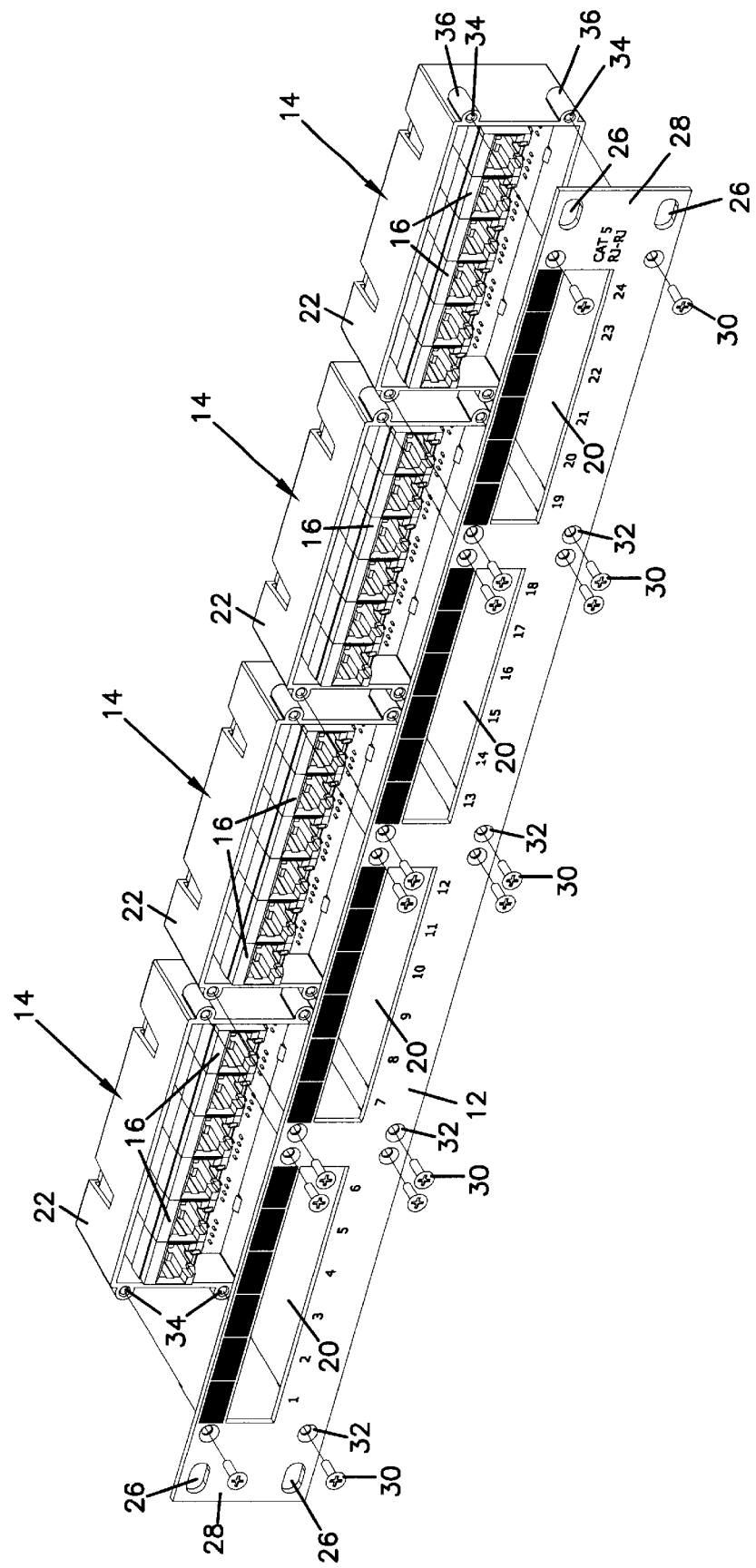
FIG. 4 is a front perspective exploded view of the telecommunications panel of FIG. 1.

Referring now to FIGS. 1 through 4, a telecommunications patch panel 10 including a faceplate 12 and four connection modules 14 is shown. As shown, each module 14 includes six front connectors, shown as jacks 16 and an equal number of rear connectors, shown as jacks 18, providing a total of twenty-four connectors each on the front and rear of patch panel 10. Alternative configurations of patch panel 10 with more or fewer modules 14 are anticipated. Also, alternative modules 14 with more or fewer jacks 16 and 18 are anticipated. Front jacks 16 are accessible through an opening 20 in faceplate 12 when module 14 is mounted to faceplate 12 as shown in the FIGS. Each rear jack 18 is accessible through an opening 24 of housing 22 of module 14. Openings 26 through flange 28, located on both ends of faceplate 12 allow patch panel 10 to be mounted to a telecommunications equipment rack or other fixtures having suitable structure to hold patch panel 10. Modules 14 are removably held to faceplate 12 by removable fasteners such as screws 30 extending through openings 32 in faceplate 12 and engaging openings 34 of modules 14.

By including jacks 16 and 18 on both sides of patch panel 10, the need to field terminate cables to connect cables to patch panel 10 has been eliminated. Connections can be made to either side of the panel using preterminated cables including standard plugs, avoiding mistakes possible in field termination. Connection can be more quickly and easily made and changed by the use of plugs on the cables connected to patch panel 10. Since each module 14 is removable from patch panel 10 and cables easily disconnected from jacks 16 and 18 of each module, field repairs can be carried out quickly.

Figure 5:
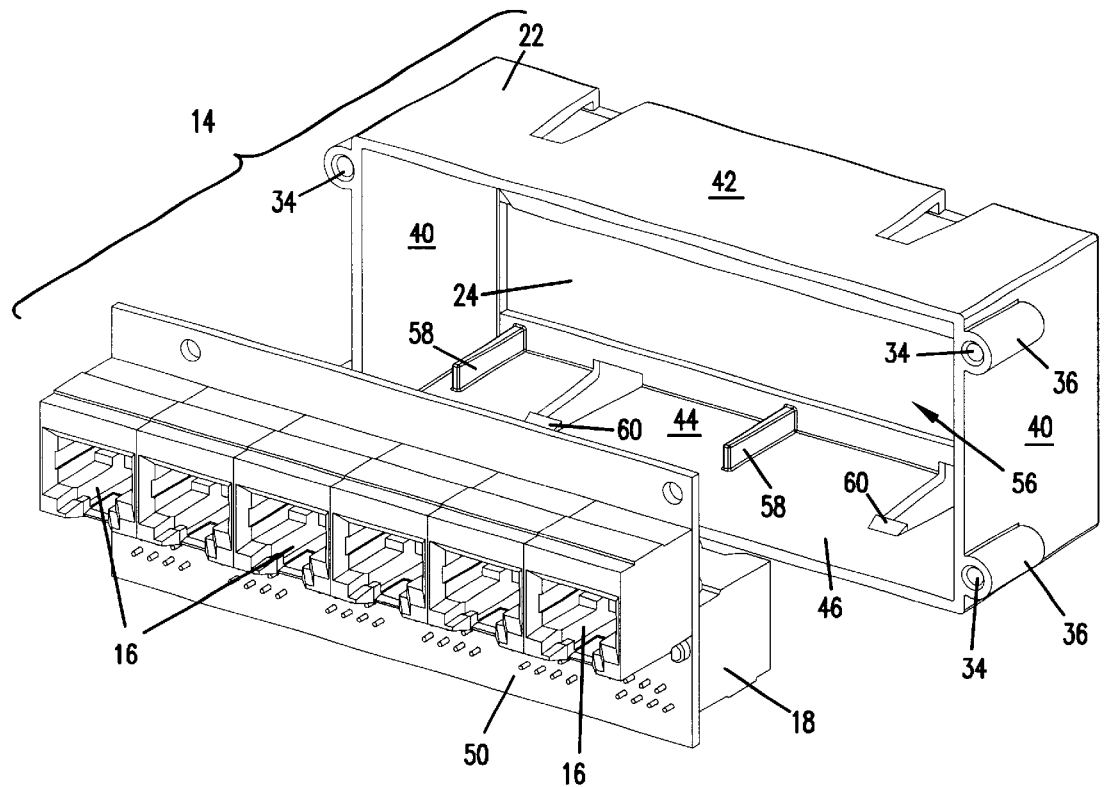
FIG. 5 is a front perspective exploded view of a telecommunications connector module in accordance with the present invention.
Figure 6:
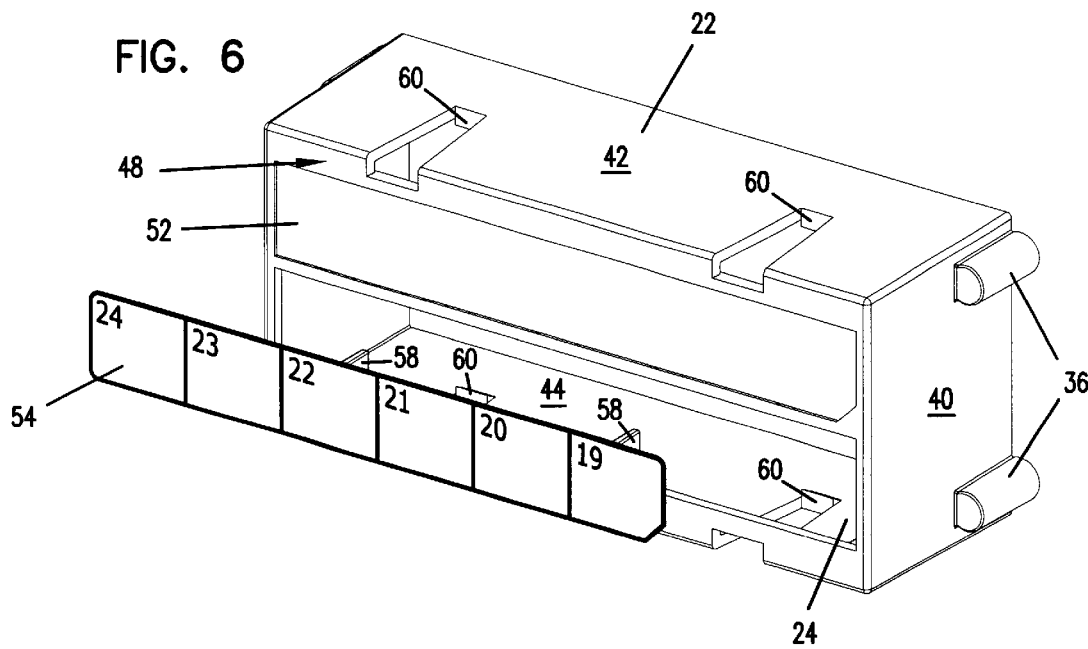
FIG. 6 is a rear perspective view of a housing for a telecommunications connector module in accordance with the present invention with a label shown separate from the housing.
Figure 7:
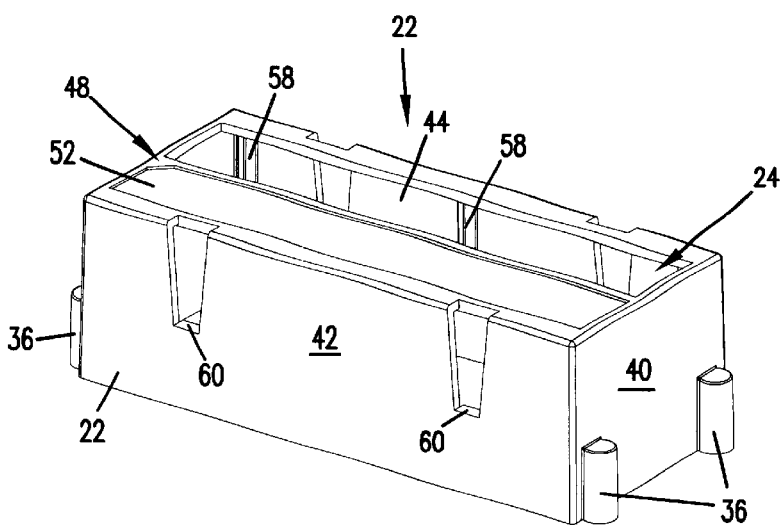
FIG. 7 is an top perspective view of the housing of FIG. 6.
Figure 8:
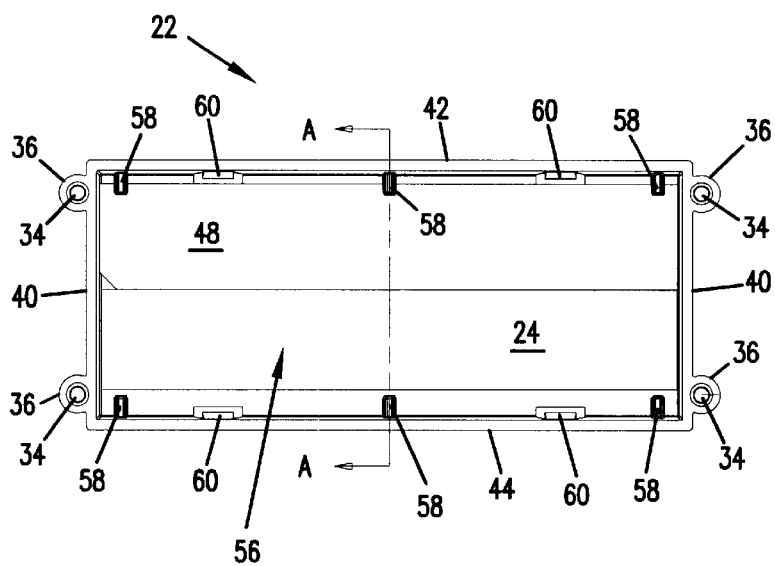
FIG. 8 is a front view of the housing of FIG. 6.
Figure 9:
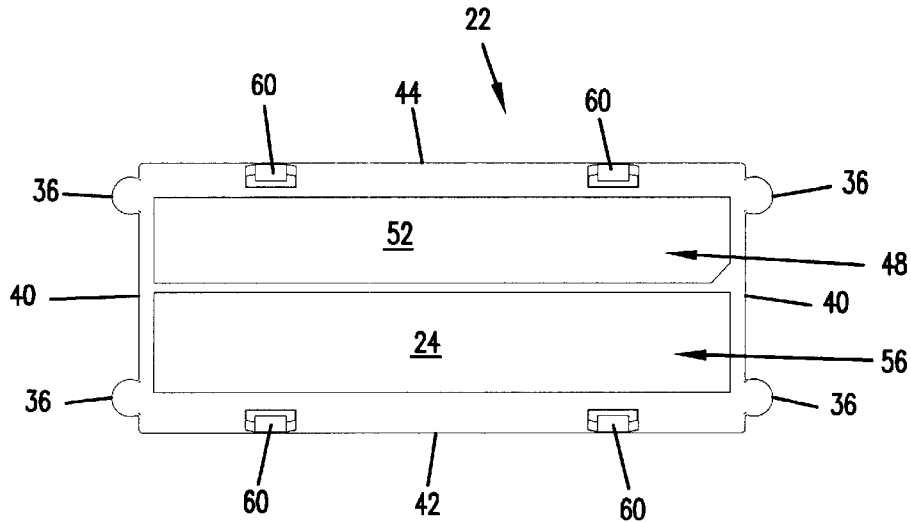
FIG. 9 is a rear view of the housing of FIG. 6.
Figure 10:
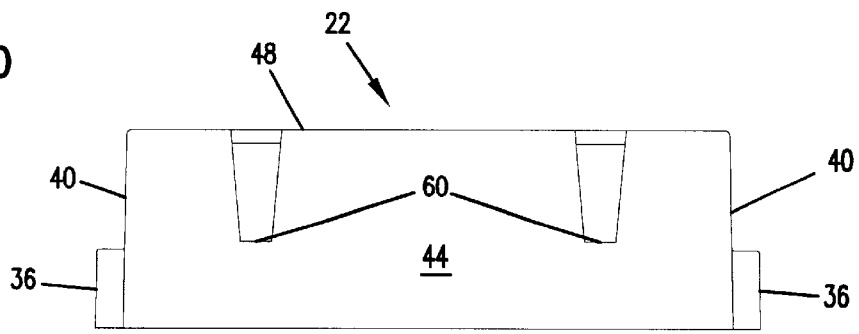
FIG. 10 is a bottom view of the housing of FIG. 6.
Figure 11:
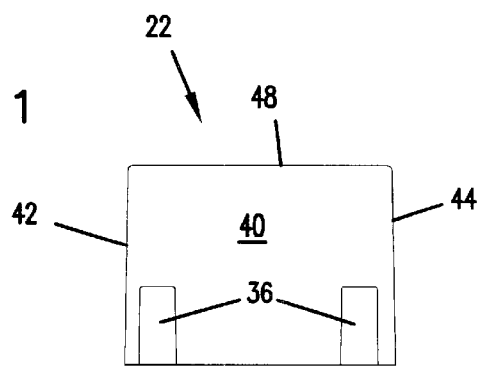
FIG. 11 is a side view of the housing of FIG. 6.
Figure 12:
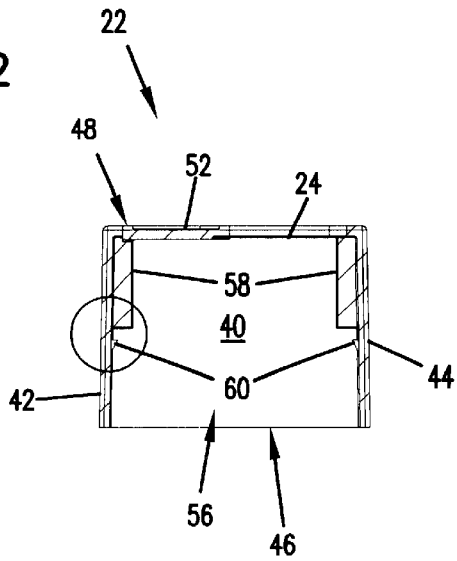
FIG. 12 is a cross-sectional view of the housing of FIG. 6, taken along line A—A in FIG. 8.
Figure 12A:
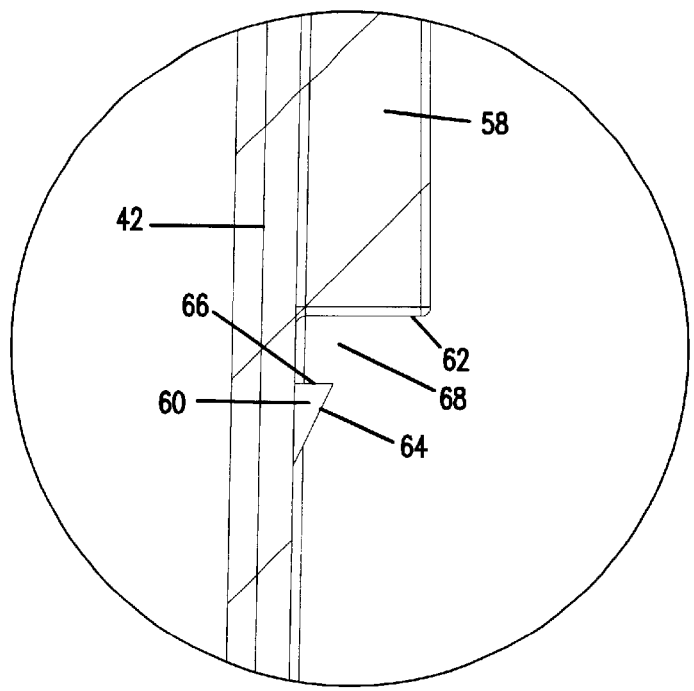
FIG. 12A is an enlarged view of the circled area of FIG. 12.
Figure 12B:
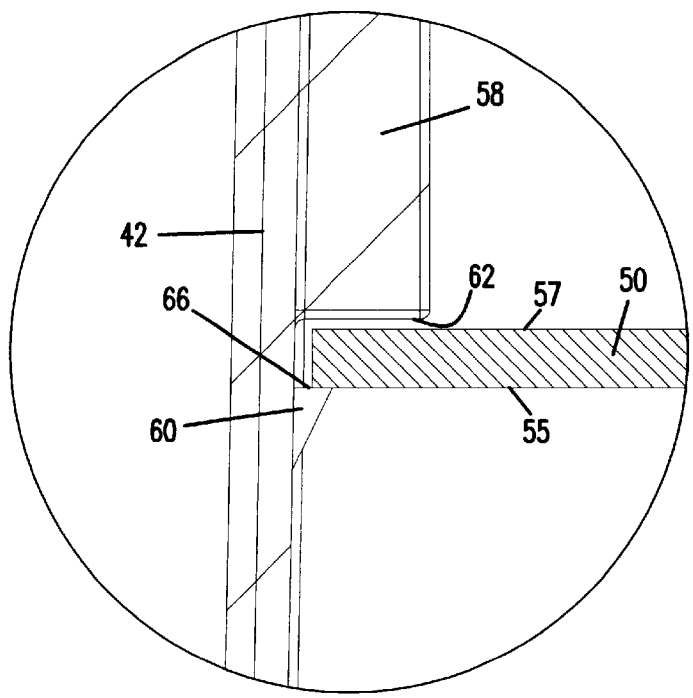
FIG. 12B is the enlarged view of FIG. 12A showing a circuit board in place within the housing.

As shown in the exploded view of module 14 in FIG. 5 and housing 22 in FIG. 6, openings 34 are located in bosses 36 located along sidewalls 40 of housing 22. Sidewalls 40, along with a top 42, a bottom 44 and a rear wall 48, define an outer shell of module 14. An opening 46, opposite rear wall 48 and opening 24 in rear wall 48, provide access to a circuit board 50 and jacks 16 and 18 mounted to circuit board 50. Adjacent opening 24 in rear wall 48 is located an indicia receiving area 52, adapted to receive an indicia strip 54, on which indicia of the circuits connected to the jacks 18 may be marked. Housing 22 provides a degree of protection to circuit board 50 and jacks 16 and 18 to prevent accidental contact or intrusion that may damage one of these items.

Within an interior 56 defined by sidewalls 40, top 42, bottom 44, rear wall 48 and opening 46 is located structure for holding circuit board 50 within housing 22. In the illustrated embodiment, the holding structure one or more ribs 58 and one or more tabs 60. The first preferred embodiment has ribs 58 and tabs 60 along bottom 44 within interior 56, and similarly located ribs 58 and tabs 60 along top 42 within interior 56.

Figure 13:
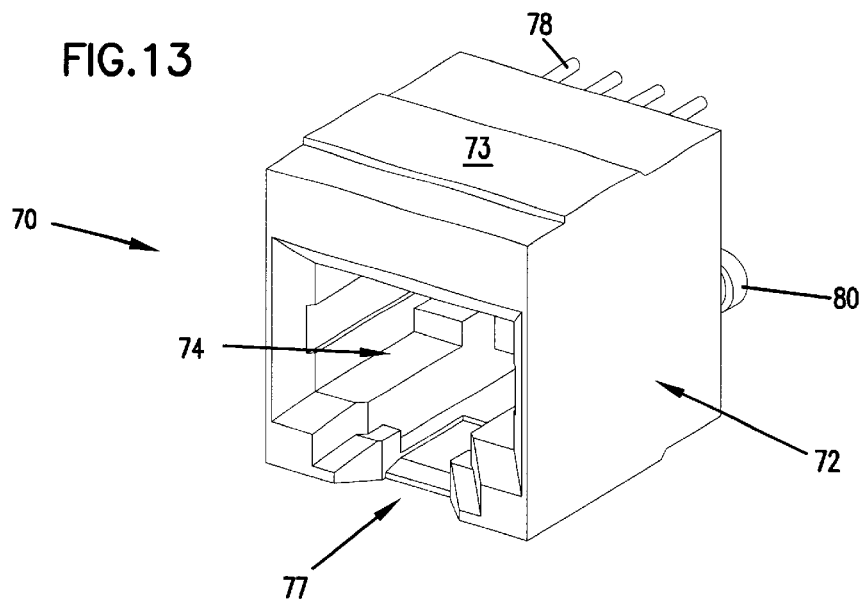
FIG. 13 is a first perspective view of a telecommunications jack for use with the telecommunications patch panel of FIG. 1.
Figure 14:
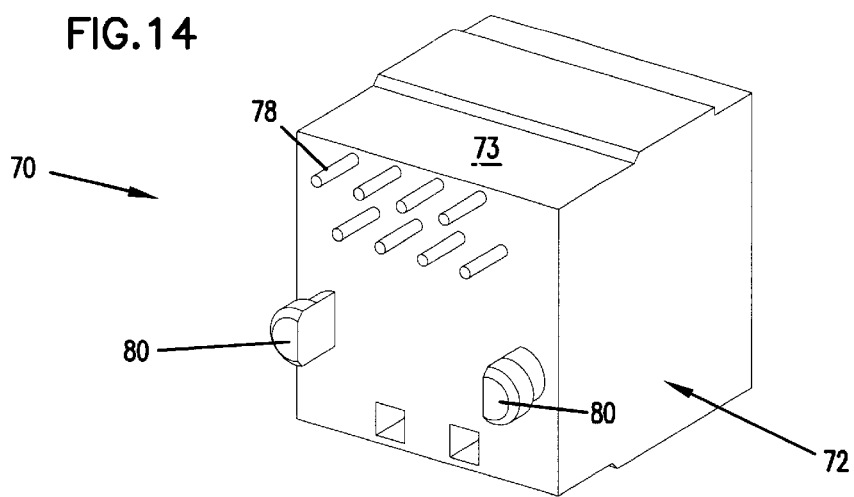
FIG. 14 is a second perspective view of the jack of FIG. 13.
Figure 15:
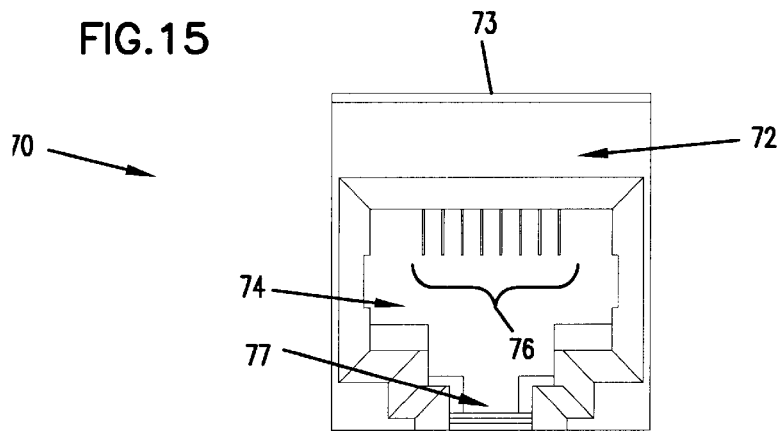
FIG. 15 is a view of the telecommunications plug receiving opening of the jack of FIG. 13.

Referring now to FIGS. 7 through 12B, further detail of housing 22 and the structure for holding circuit board 50 within interior 56 of housing 22 is shown. Each tab 60 is triangular is cross-section and includes a ramped surface 64 and a locking surface 66. Each rib 58 includes a locking surface 62 which opposes locking surface 66 and in cooperation with locking surface 66 forms a circuit board receiving space 68. Locking surface 62 is offset from opening 46 toward rear wall 48 to position circuit board 50 so that plug receiving end 70 (shown in FIG. 13) of jack 16 is immediately adjacent opening 20 of faceplate 12 when module 14 is attached as part of patch panel 10. Similarly, locking surface 66 is offset from rear wall 48 toward opening 46 to position circuit board 50 so that plug receiving end 70 of jack 18 is adjacent opening 24 of housing 22 of module 14. In the first preferred embodiment, circuit board 50 is held so that jacks 18 are essentially flush with rear wall 48 and jacks 16 are essentially flush with faceplate 12 of patch panel 10.

Housing 22 is formed of a resilient deformable material to permit top 42, bottom 44 and tabs 60 to deform outward as circuit board 50 is inserted through opening 46 into interior 56 and engage ramped surfaces 64. The combination of tabs 60 and top 42 and bottom 44 should be deformable enough to permit circuit board 50 to displace tab 60 sufficiently for circuit board 50 to enter circuit board receiving space 68. Once circuit board 50 has entered circuit board receiving space 68, top 42, bottom 44 and tabs 60 should be sufficiently resilient to permit tabs 60 to move inward and capture circuit board 50 in circuit board receiving space by locking surface 66. The deformability of top 42 and bottom 44 should also be sufficient to permit top 42 and bottom 44 to be urged outward so that locking surfaces 66 release circuit board 50 and the board can be removed from interior 56. Ribs 58 extend into interior 56 only so far as necessary to adequately and securely prevent circuit board from moving toward opening 24. Due to possible deflection of circuit board 50 along its longest dimension, it is desirable for ribs 58 to be located along the longest walls of housing 22, i.e., top 42 and bottom 44.

As shown, three ribs 58 are spaced apart in interior 56 along both top 42 and bottom 44. Fewer ribs 58 would be adequate and more can be used as desired. The number of ribs along top 42 and bottom 44 need not be the same. Two tabs 60 are shown spaced apart along top 42 and bottom 44. More or fewer tabs may be used. Tabs 60 are preferably located along top 42 and bottom 44 spaced at a distance from sides 44 to permit adequate deformation of top 42 and bottom 44 to release circuit board 50 from circuit board receiving space 68.

Referring now to FIGS. 13 through 18, a telecommunications jack 70 is shown. Jack 70 is the type used for both jack 16 and jack 18 in the FIGS. above. Jack 70 shown is manufactured by the Stewart Co. and is part number SS-7188V-A-NF. Jack 70 includes a body 72 with a top 73, a plug receiving opening 74 in one side and a board mounting side 75 opposite plug receiving opening 74. Plug receiving opening 74 is adapted to receive a plug attached to the end of a twisted pair telecommunications cable. Slot 77 within plug receiving opening 74 is adapted to receive and releasably hold a locking tab of the plug, the tab being located on the opposite side of the plug from the contacts within the plug. As shown, opening 74 conforms to an RJ-45 standard and is adapted to receive an RJ-45 plug connected to an unshielded twisted pair cable. It is anticipated that other similar format plugs and connectors may be adapted within the scope of the present invention.

Figure 18:
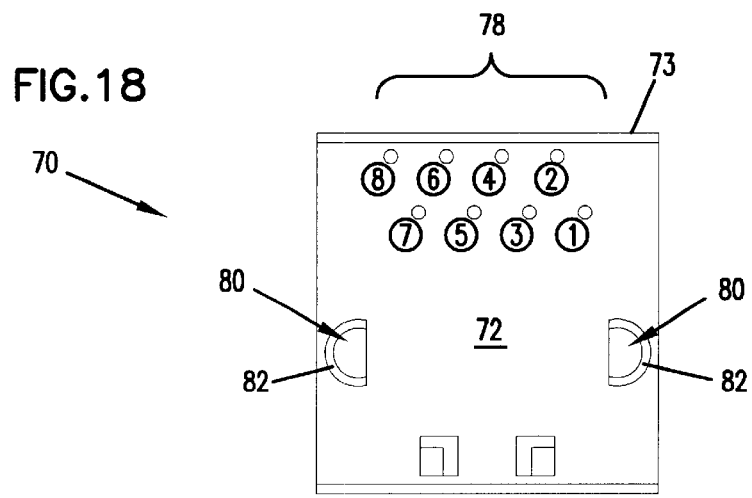
FIG. 18 is a view of the circuit board mounting end of the jack of FIG. 13.

When an RJ-45 plug is inserted within opening 74, contacts on the plug which are electrically connected to wires within the telecommunications cable, are placed in electrical contact with springs 76. Springs 76 are in electrical contact with pins 78 extending from body 72 on board mounting side 75. The combination of pins 78 and springs 76 allow wires within the telecommunications cable to be electrically linked with circuits on a circuit board 50 (shown and discussed further below). Pins 78 are numbered from 1 to 8, as shown in FIG. 18.

Also extending from board mounting side 75 are posts 80, provided to allow jack 70 to be mounted to circuit board 50. Each post 80 as shown is made of a resilient deformable material and includes a ramped surface 82, a wide portion 84 and a narrower portion 86. A pair of spaced apart posts 80 cooperate with a pair of similarly spaced apart post openings 88 in circuit board 50 (as described below) to mount jack 70 to circuit board 50. Ramped surfaces 82 engage a first side of circuit board 50 at post openings 88 and deflect posts 80 inward sufficiently for wide portions 84 to enter and pass through post openings 88. Once wide portion 84 passes through post opening 88, posts 80 return to their original shape, forcing wide portions 84 to engage a second side of circuit board 50 and hold jack 70 to circuit board 50.

Figure 19:
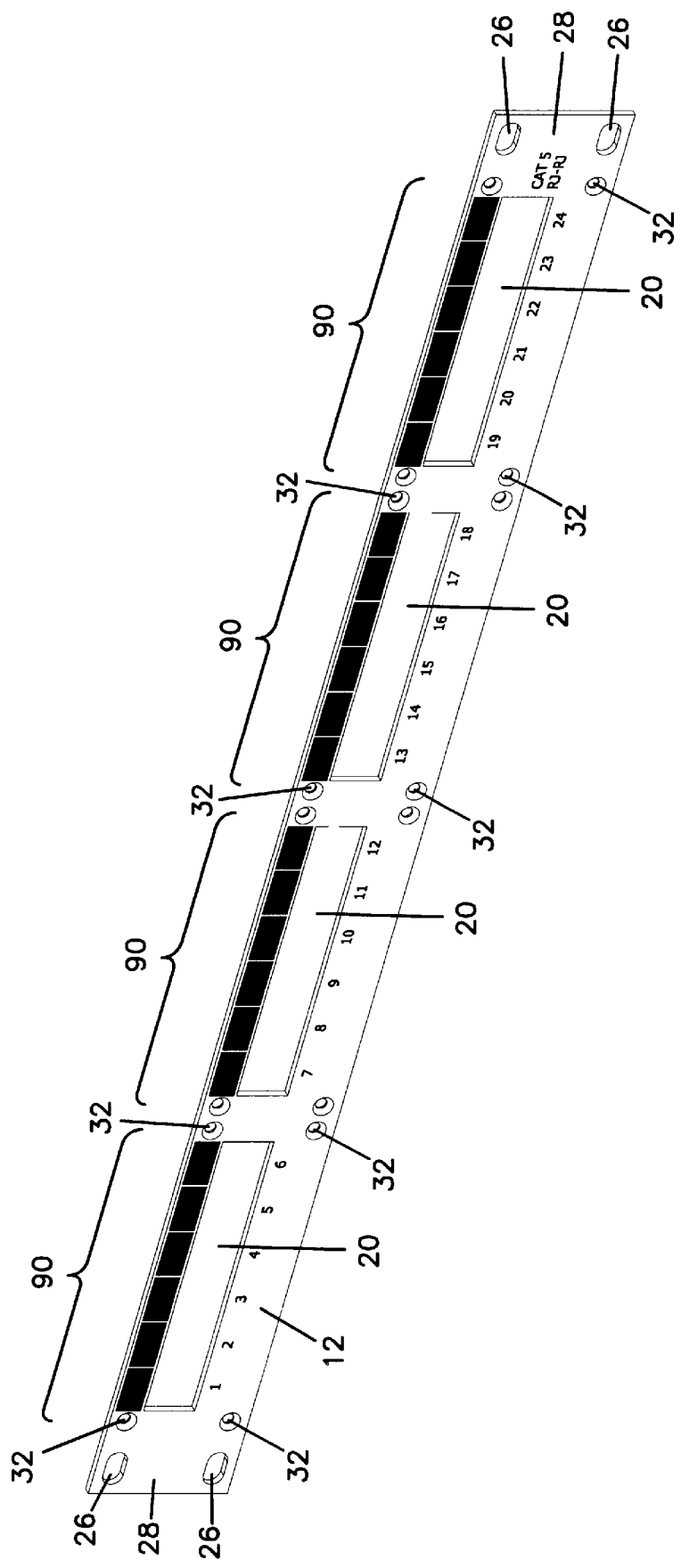
FIG. 19 is a front perspective view of the faceplate of the telecommunications patch panel of FIG. 1.
Figure 20:
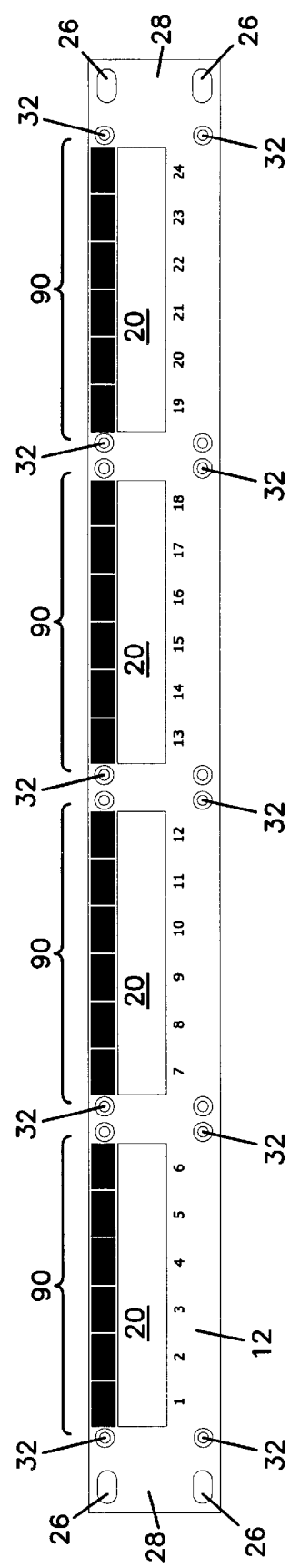
FIG. 20 is a front view of the faceplate of FIG. 19.

FIGS. 19 and 20 show further features of faceplate 12. Faceplate 12 includes flanges 28 with mounting openings 26, module mounting openings 32 and front connector access openings 20. Faceplate 12 also includes indicia holders 90 adjacent openings 20. A location within an indicia holder 90 is provided corresponding to every jack 16 accessible through openings 20, to receive indicia of the circuit to which that jack 16 is connected.

Figure 21:
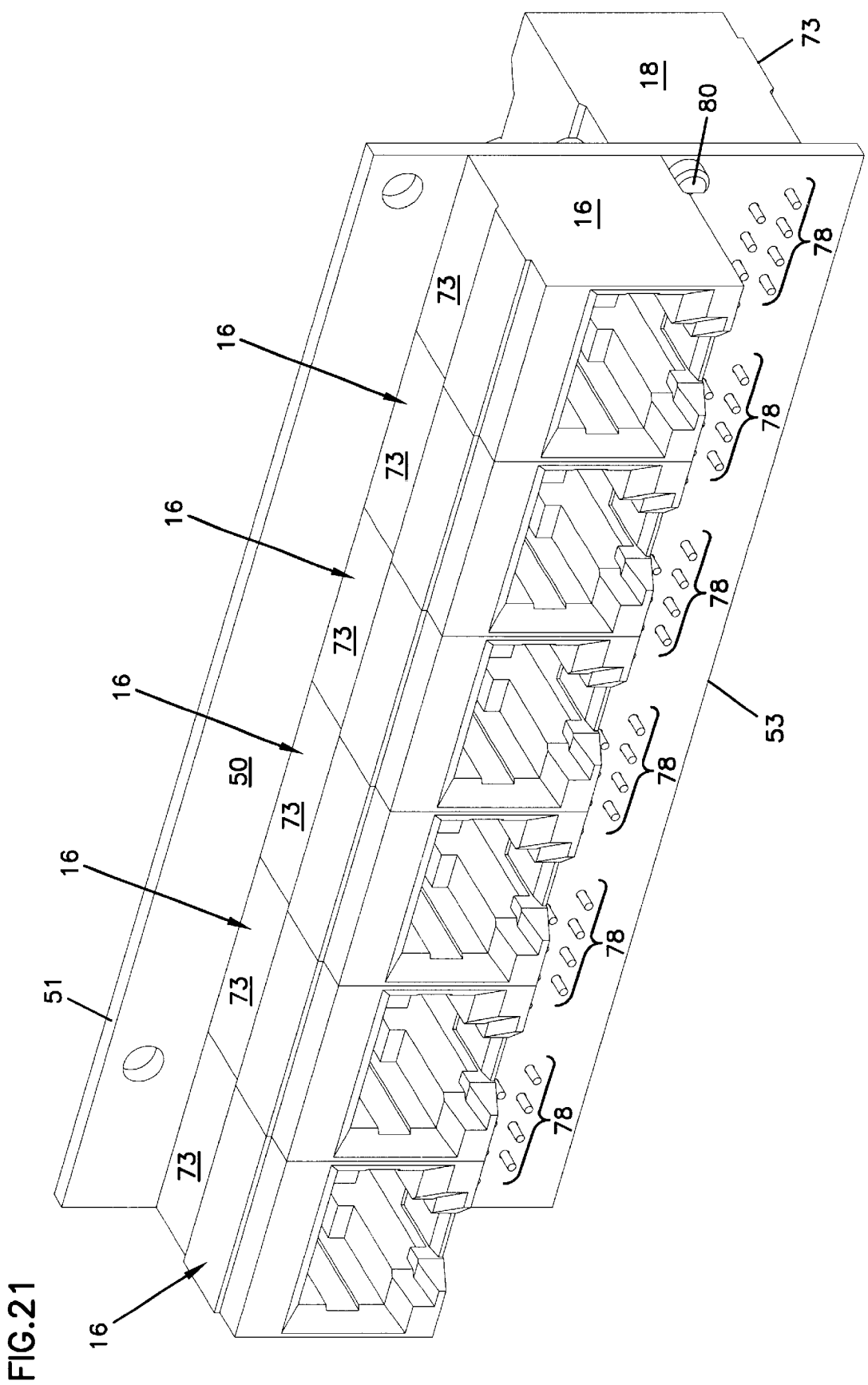
FIG. 21 is a perspective view of a first side of a circuit board for use with the telecommunications connector module of FIG. 6 with a plurality of telecommunications jacks of FIG. 13 mounted.
Figure 22:
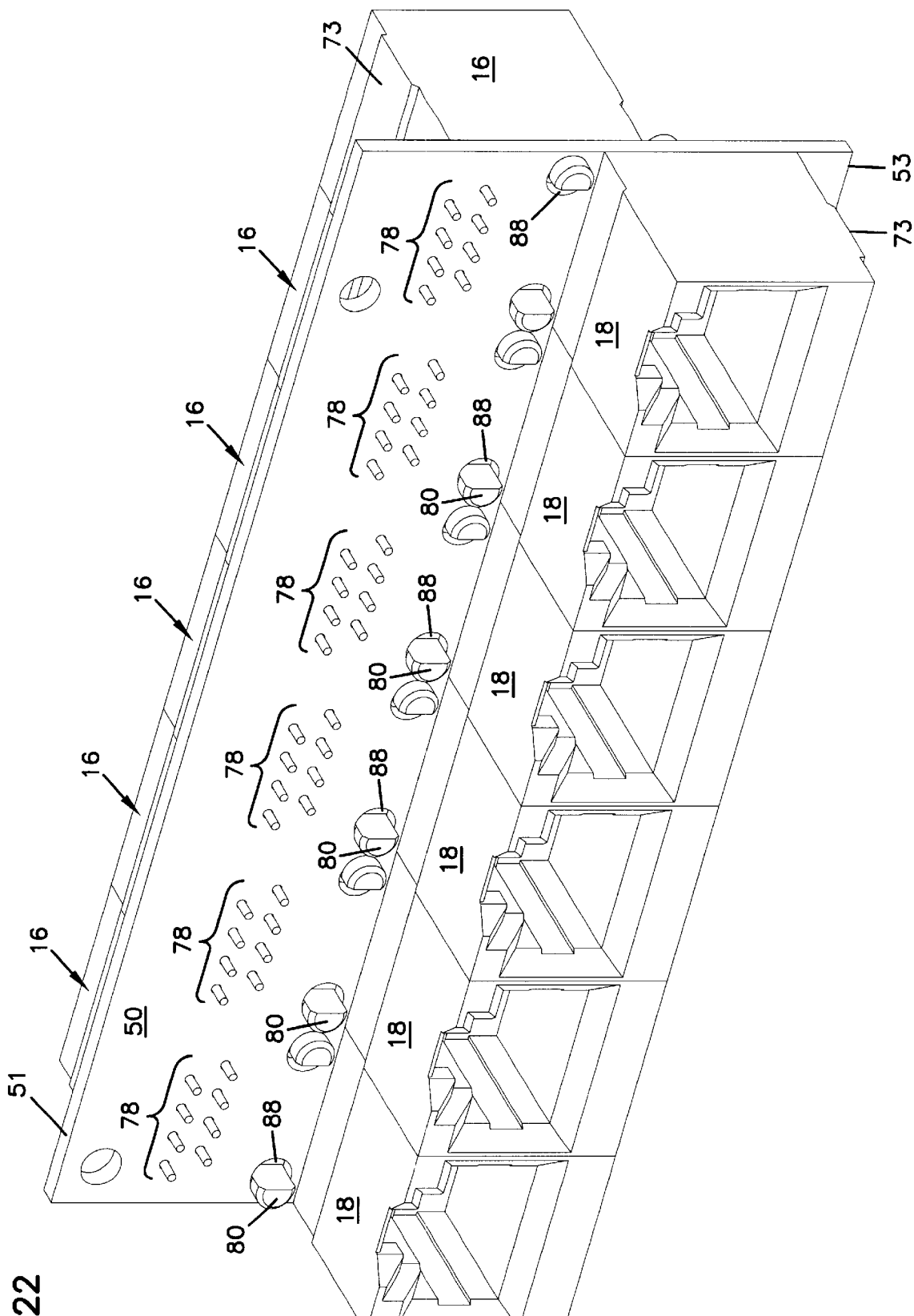
FIG. 22 is a perspective view of a second side of the circuit board of FIG. 21.
Figure 22A:
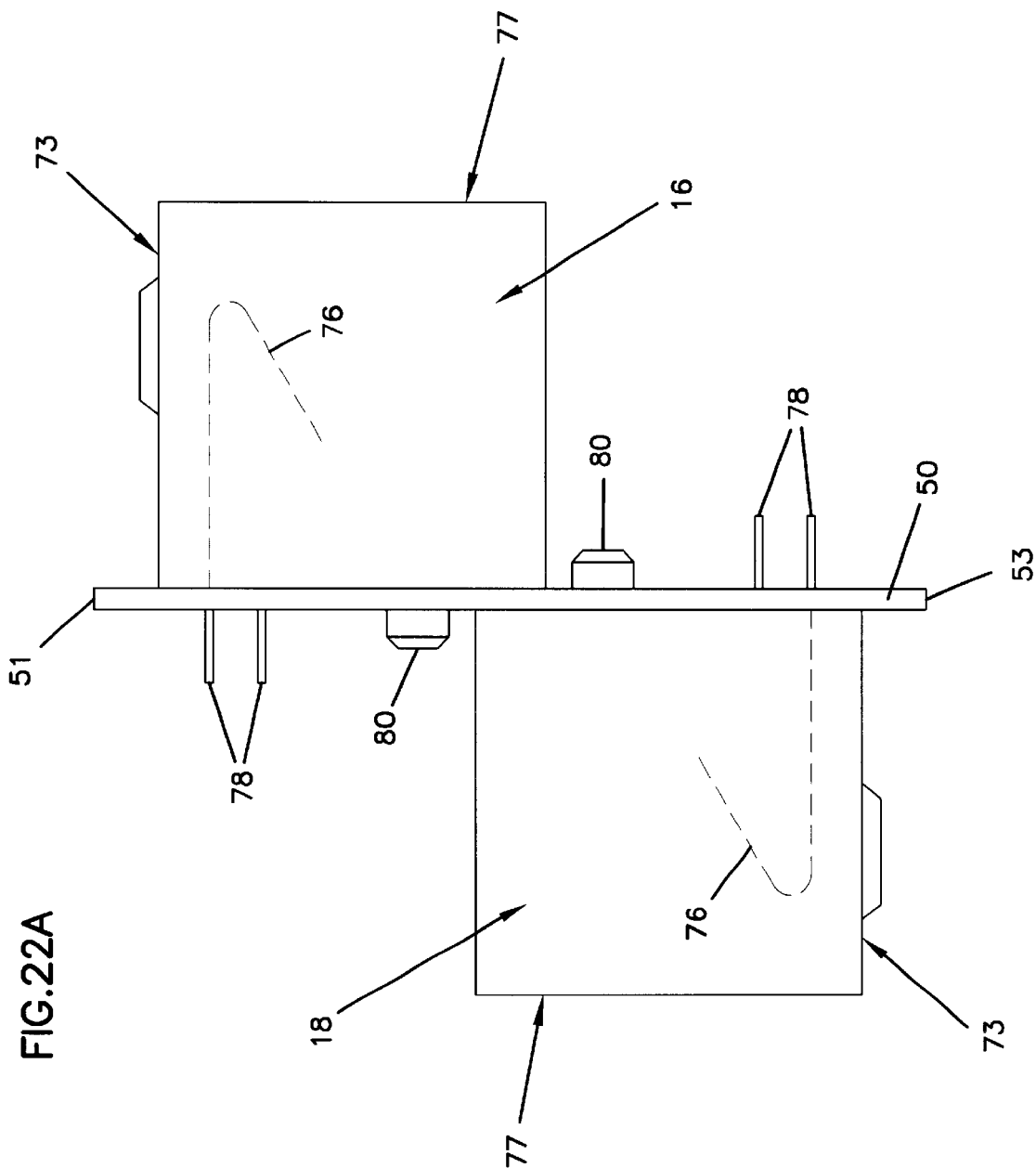
FIG. 22A is a end view of the circuit board of FIG. 21 showing the orientation of a representative contact spring within each jack.
Figure 23:
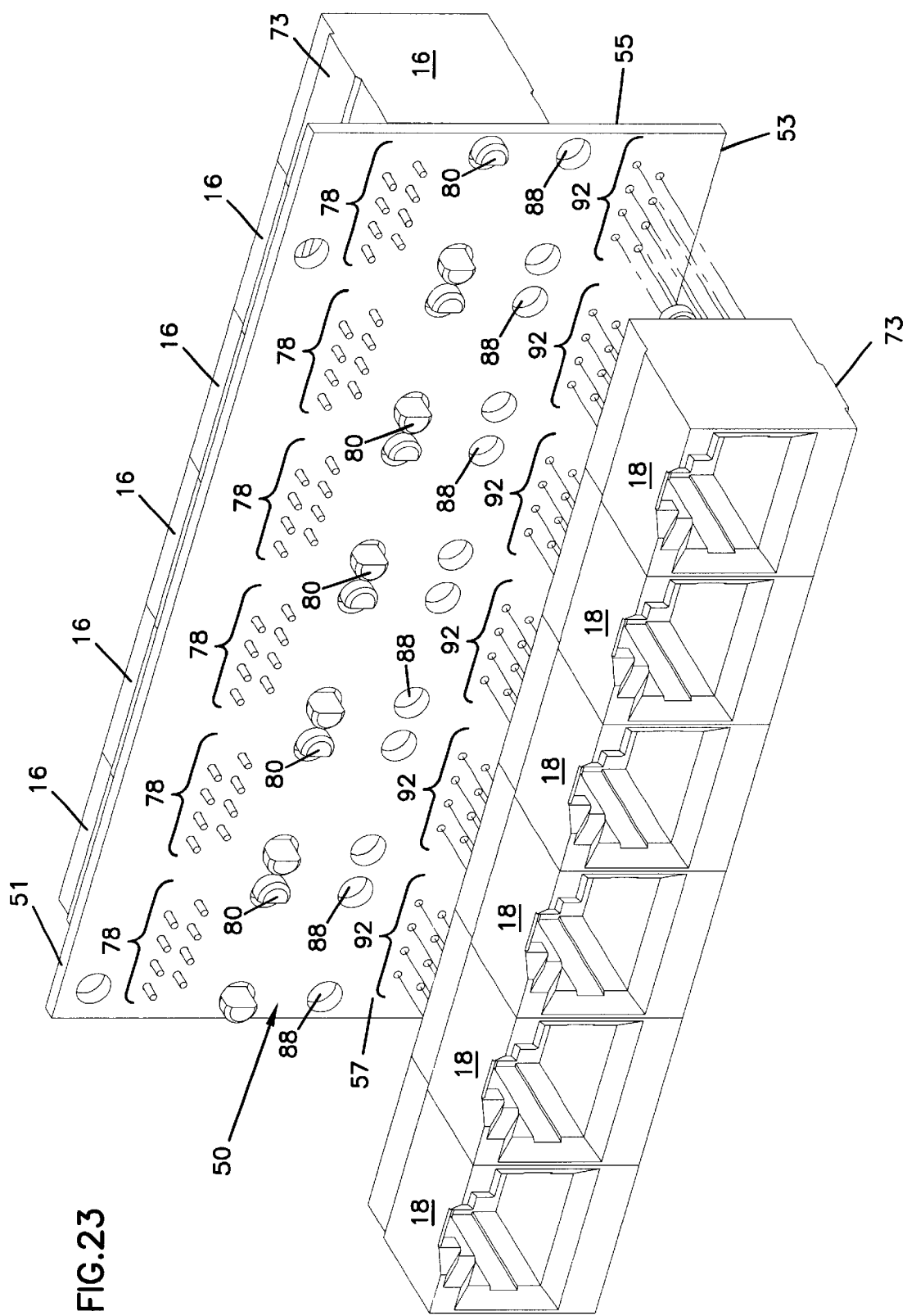
FIG. 23 is a partially exploded view of the circuit board of FIG. 21, showing the mounting of a plurality of telecommunications jacks of FIG. 13 to the first side of the circuit board.
Figure 24:
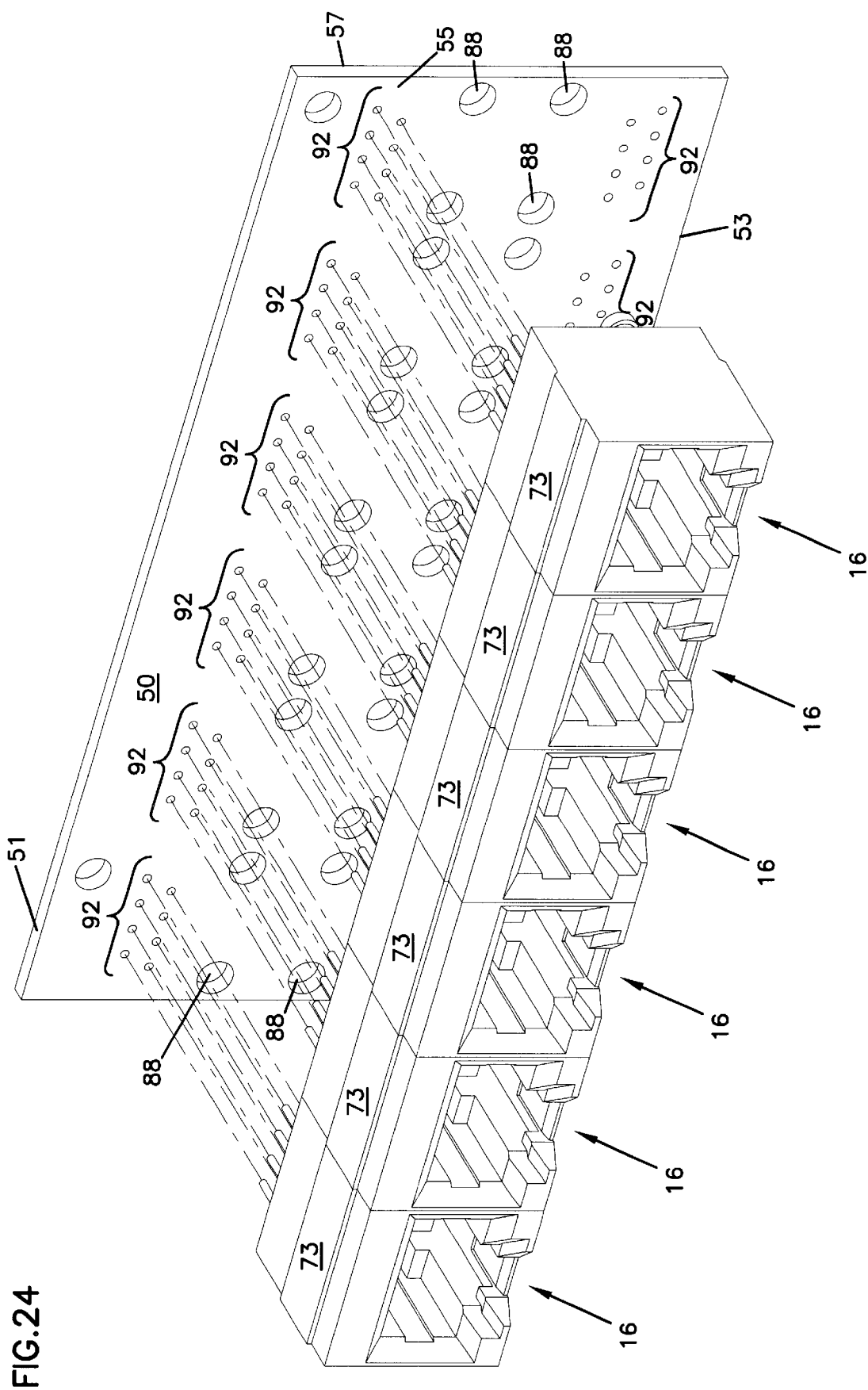
FIG. 24 is an exploded view of the circuit board of FIG. 22 with the connectors removed from the first side of the board, showing the mounting of a plurality of telecommunications jacks of FIG. 13 to the second side of the board.

FIGS. 21 and 22 show a front 55 and a rear 57, respectively, of circuit board 50 with jacks 16 and 18 mounted to front 55 and rear 57, respectively. Pins 78 from each jack 16 and 18 extend through pin openings 92 in circuit board 50 when posts 80 of each jack 16 and 18 are inserted into post openings 88 and wide portions 84 of each post 80 engages circuit board 50. In addition to be mounted on opposite sides of circuit board 50, jacks 18 are inverted with respect to jacks 16. Top 73 of each jack 16 is oriented toward a first edge 51 of circuit board 50, while top 73 of each jack 18 is oriented toward a second opposite edge 53 of circuit board 50. A plug oriented for insertion into a jack 16 would have to be rotated about the axis of insertion one half turn to fit within jack 18. FIG. 22A illustrates the inverted orientation of springs 76, top 73 and slot 77 between jacks 16 and 18 when mounted to circuit board 50 in the illustrated embodiment. FIG. 23 shows rear 57 of circuit board 50, with jacks 18 exploded from circuit board 50, showing pin openings 92 and post openings 88. FIG. 24 shows front 55 of circuit board 50 with jacks 18 removed and jacks 16 exploded, showing the arrangement of pin openings 92 and post openings 88 for both jacks 16 and jacks 18.

Figure 25:
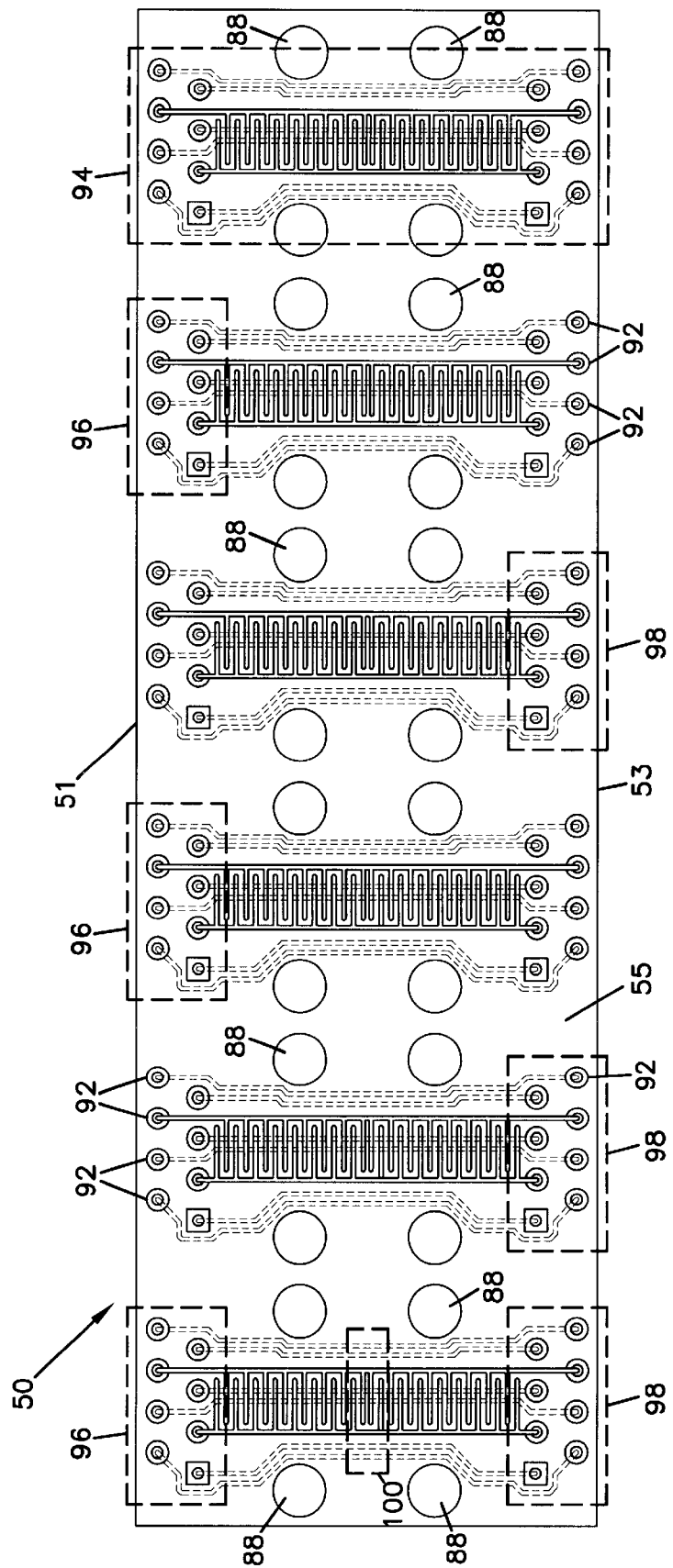
FIG. 25 is a composite view of a circuit board for use with a telecommunications patch panel according to the present invention, with circuits on a first layer of the circuit board shown as hidden lines and circuits on a second layer of the circuit board shown as solid lines, including six circuits on the circuit board.
Figure 26:
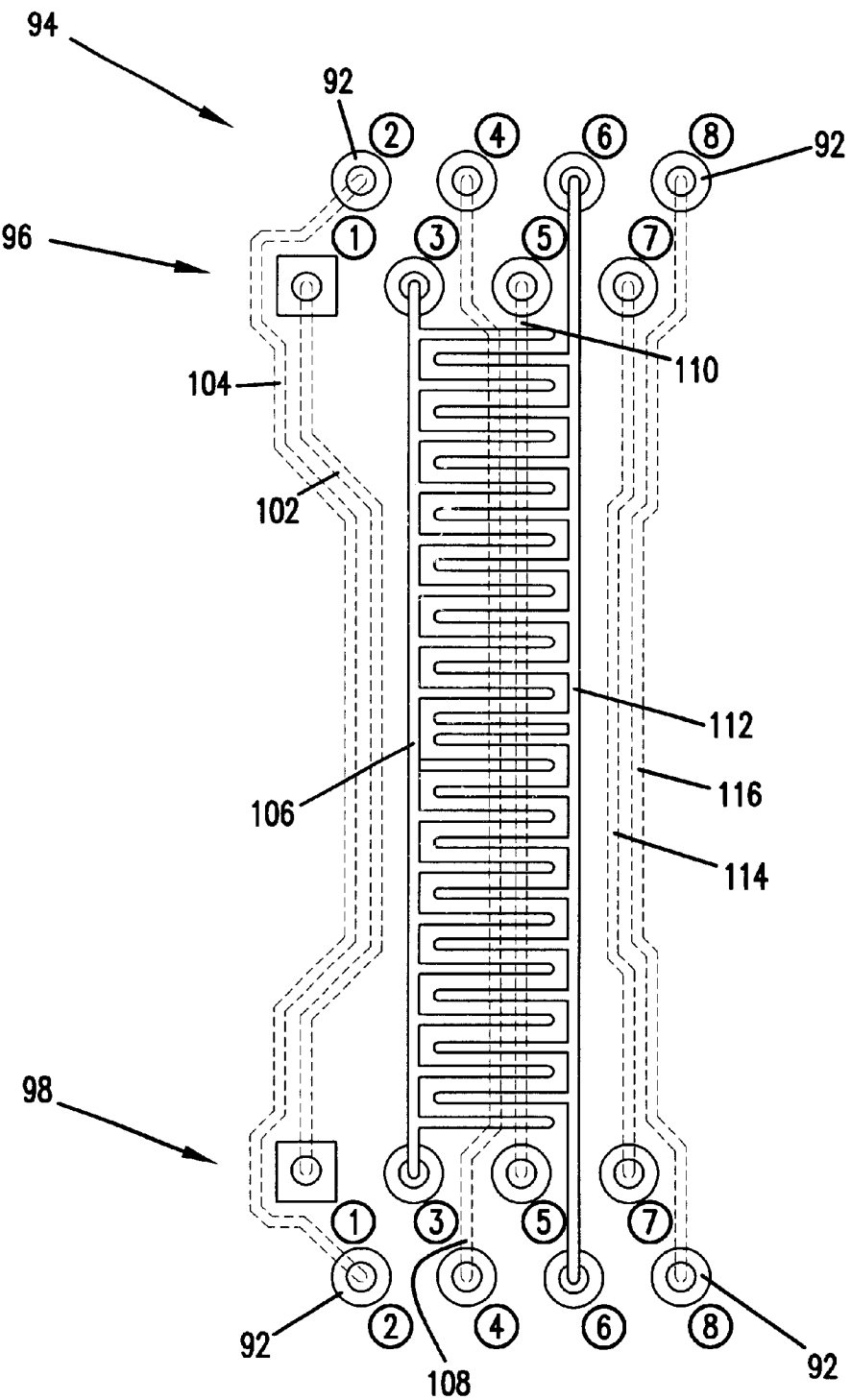
FIG. 26 is an enlarged view of a single circuit of the circuit board of FIG. 25.

Referring now to FIGS. 25 and 26, circuit traces 100 on circuit board 50 linking openings 92 are shown. FIG. 25 shows the layout of openings 92 on circuit board 50 adapted for mounting six jacks 16 to front 55 and six jacks 18 to rear 57. Openings 92 are configured in an array and define a mounting location 96 on front 55 for each jack 16 and a mounting location 98 on rear 57 for mounting each jack 18. The array of openings 92 of mounting location 98 is positioned in a mirror image of the array of openings 92 of mounting location 96, to permit jacks 16 and 18 to be mounted on opposite sides of circuit board 50 with springs 76 of each jack 16 inverted with respect to each jack 18 as shown in FIG. 22A. An individual circuit 94 is defined to include one mounting location 96, one mounting location 98, and the circuit traces 100 that connect the two mounting locations.

Figure 16:
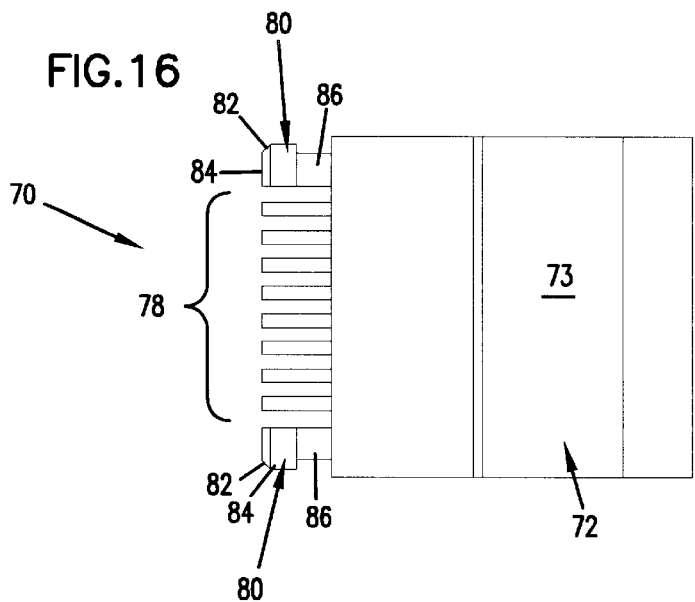
FIG. 16 is a top view of the jack of FIG. 13.
Figure 17:
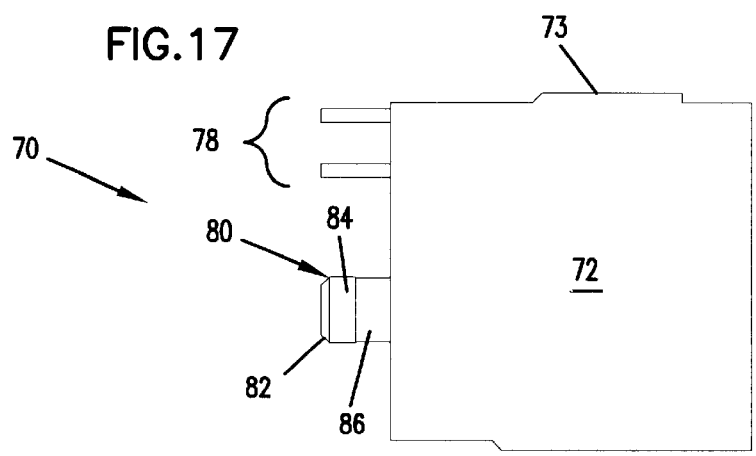
FIG. 17 is a side view of the jack of FIG. 13.

FIG. 26 shows an individual circuit 94 with openings 92 of mounting location 96 numbered from 1 to 8, corresponding to the numbering of pins 78 of connector 70, shown in FIG. 16, when mounted as a jack 16. Openings 92 of mounting location 98 are also numbered from 1 to 8 to correspond to the numbering of pins 78 of jack 70 shown in FIG. 16, when mounted as a jack 18. Circuit trace 102 provides an electrical connection between openings 92 numbered 1 of mounting locations 96 and 30 98. Similarly, circuit trace 104 connects openings 92 numbered 2, circuit trace 106 connects openings 92 numbered 3, circuit trace 108 connects openings 92 numbered 4, circuit trace 110 connects openings 92 numbered 5, circuit trace 112 connects openings 92 numbered 6, circuit trace 114 connects openings 92 numbered 7, and circuit trace 116 connects openings 92 numbered 8.

To reduce cross-talk that can degrade the speed or quality of data being transmitted across circuit traces 100 of circuit board 50, different traces are paired together and these traces are positioned adjacent to one another on circuit board 50. These pairings correspond to the pairing of wires twisted together within the telecommunications cable connected to a jack 16 or 18. Traces 102 and 104 are paired together, as are traces 106 and 112, traces 108 and 110, and traces 114 and 116. Each pair of traces is spaced apart from the other pairs.

To improve impedance and further reduce cross-talk, an increased level of mutual capacitance is desirable in the pair of traces 106 and 112. To accomplish this increased level of mutual capacitance in these traces relative to the other traces in an individual circuit 94, traces 106 and 112 are formed in a intertwined comb pattern, as shown in the unbroken lines in FIG. 25A. Since these traces overlay the physical location of other traces in individual circuit 94, traces 106 and 112 with increased capacitance are located on a first trace layer of circuit board 50 from the other traces. These other traces, 102, 104, 108, 110, 114 and 116, are shown in broken lines in FIGS. 25 and 26 but represent unbroken electrical pathways on a second trace layer of circuit board 50.

Figure 26A:
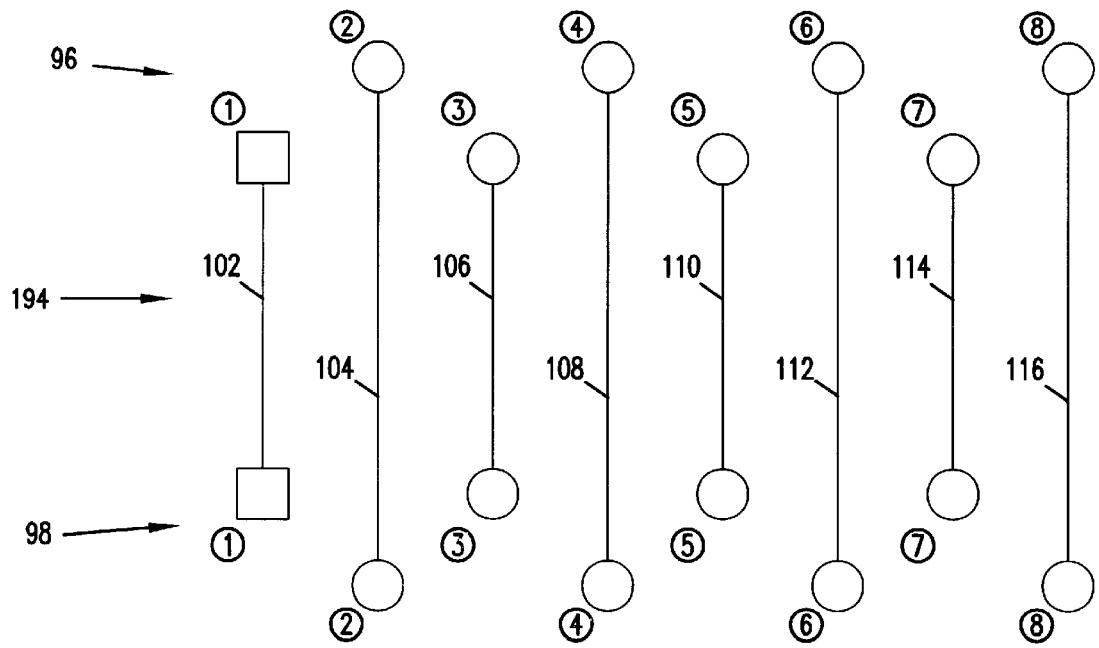
FIG. 26A is a diagrammatic view of a first alternative circuit for a circuit board in accordance with the present invention.
Figure 26B:
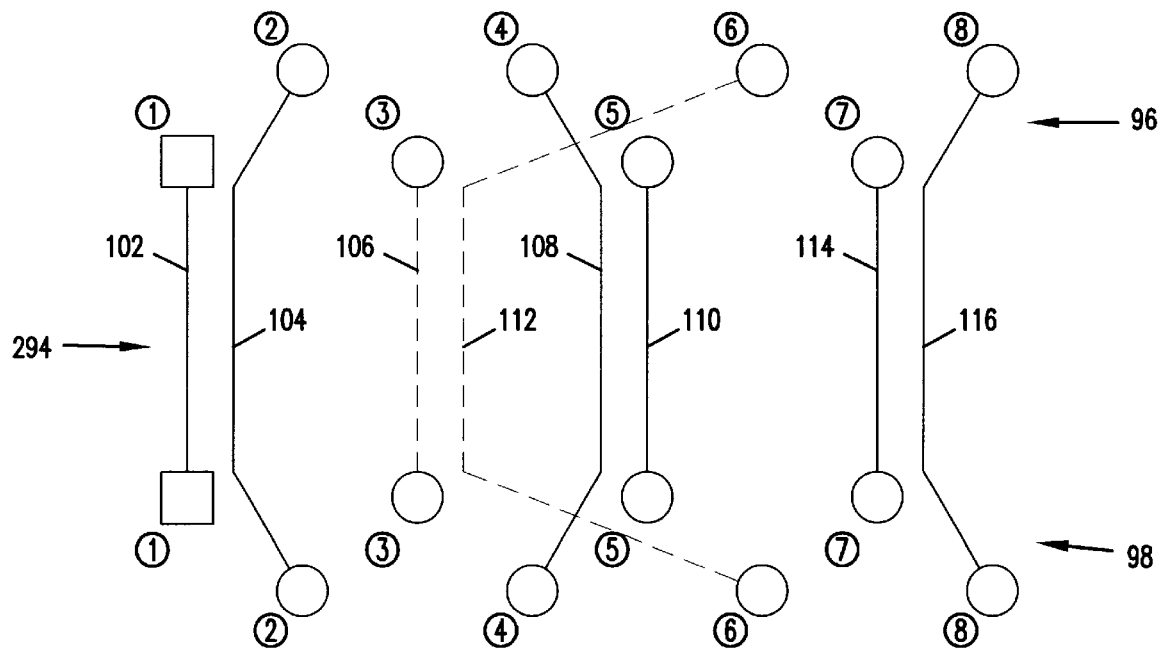
FIG. 26B is a diagrammatic view of a second alternative circuit for a circuit board in accordance with the present invention.

A first alternative circuit board 50 containing circuitry 194 on a single trace layer is shown in FIG. 26A. A second alternative circuit board 50 containing circuitry 294, with the same pairing of traces described above with regard to FIGS. 25 and 26, is shown in FIG. 26B with traces 106 and 112 in dashed lines to indicate they are located on a second circuit trace layer but not incorporating a layout providing increased capacitance.

Figure 27:
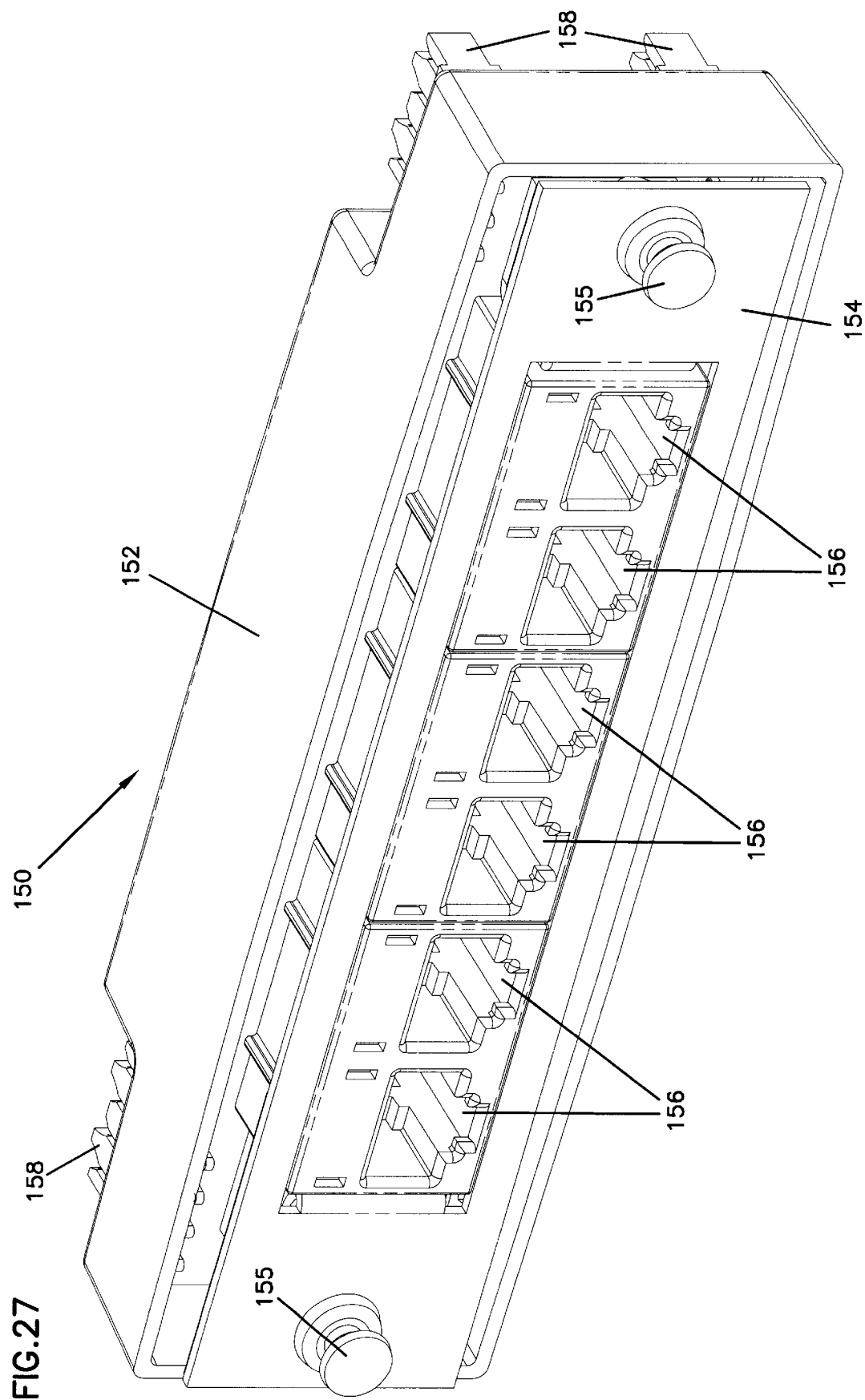
FIG. 27 is a front perspective view of an alternative embodiment of a telecommunications patch panel according to the present invention.
Figure 28:
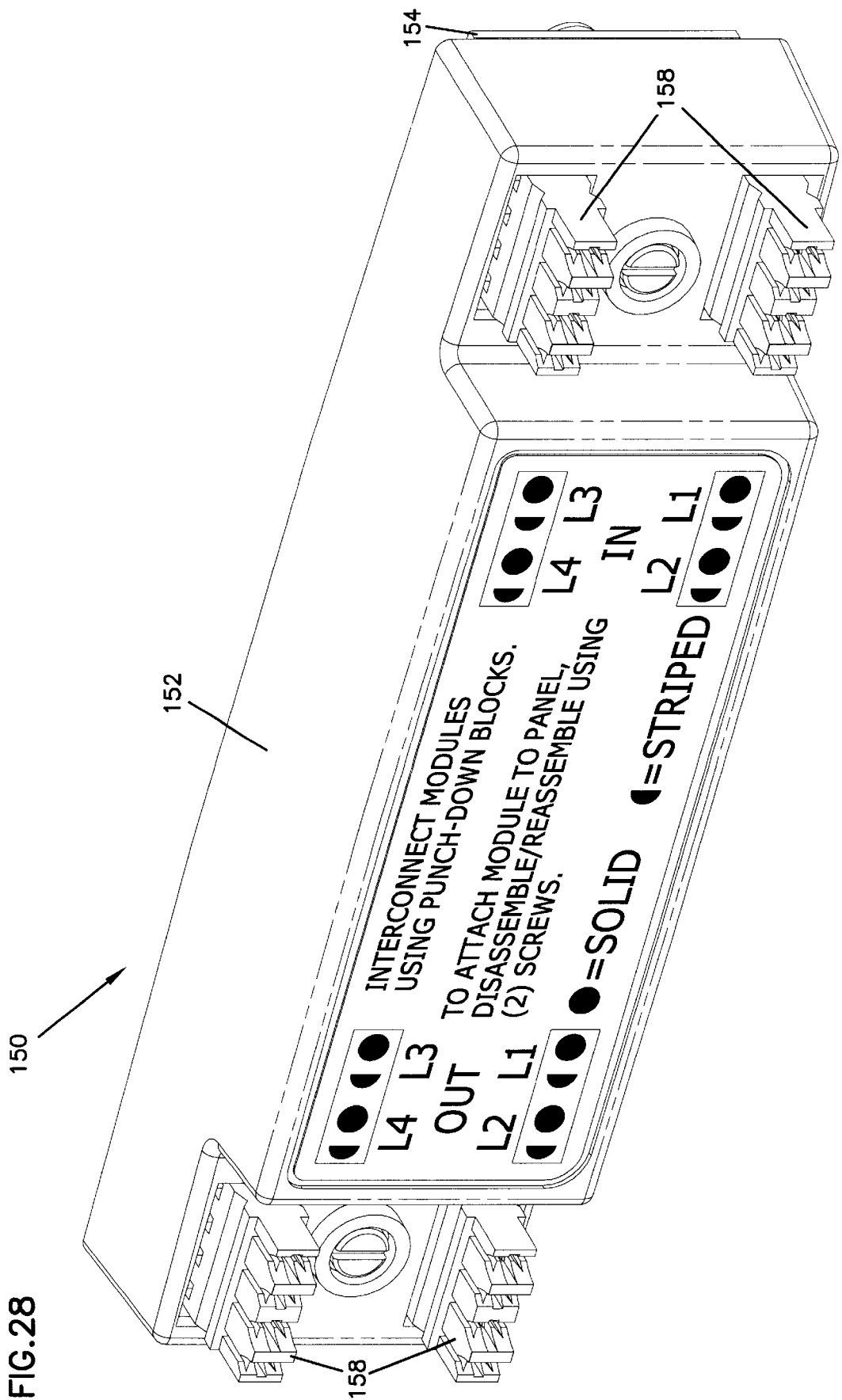
FIG. 28 is a rear perspective view of the patch panel of FIG. 27.
Figure 29:
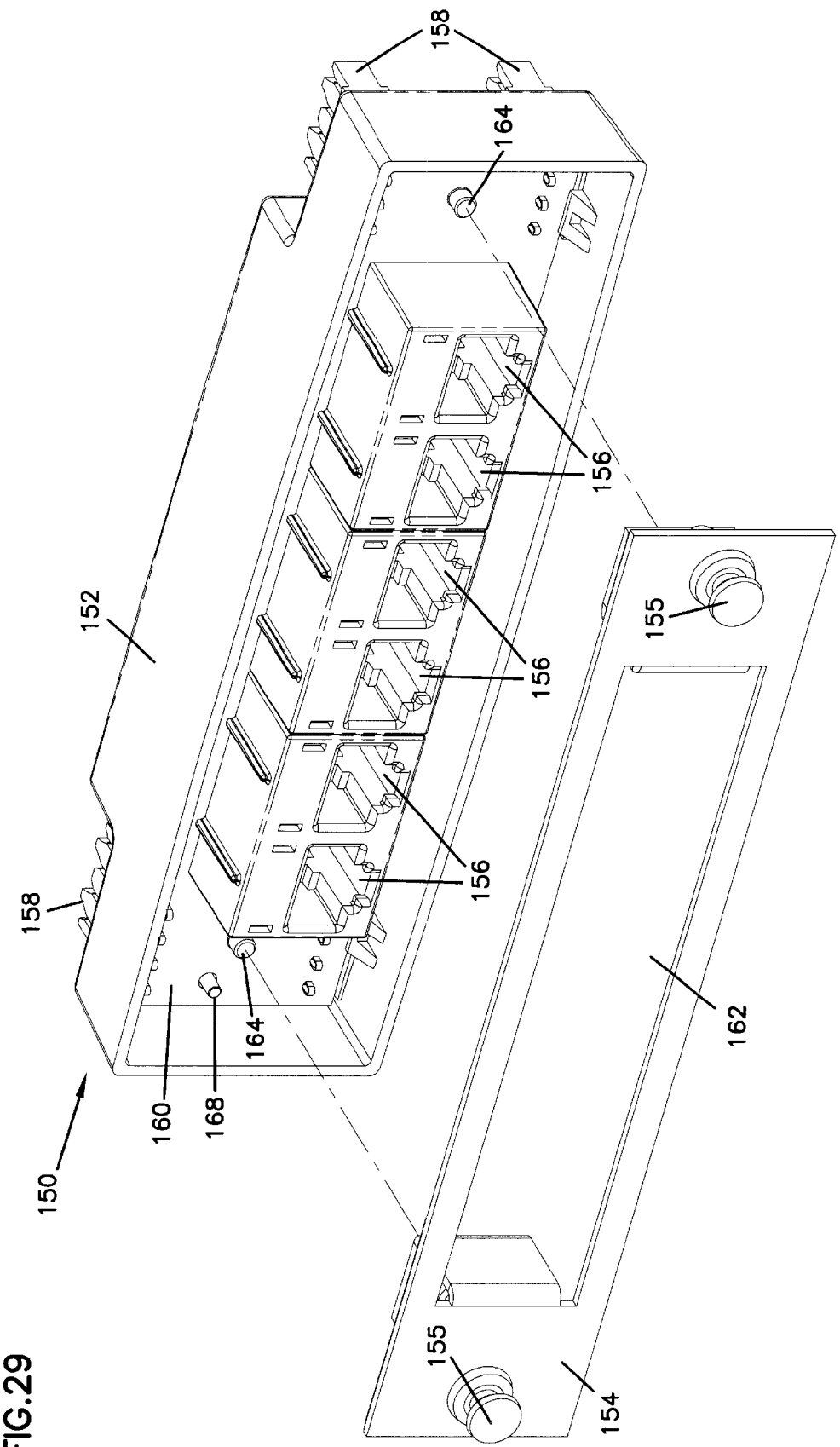
FIG. 29 is a first partially exploded front view of the patch panel of FIG. 27, showing the front cover removed.

FIGS. 27 and 28 show a second alternative telecommunications connection module 150 in accordance with the present invention. Module 150 includes a housing 152, a faceplate 154, a plurality of front connectors 156 and a plurality of rear connectors 158. Releasable anchor 155 is provided to removably mount faceplate 154 to a panel, wall or bulkhead. As shown, front connectors 156 are RJ-45 jacks 156 and rear connectors 158 are insulation displacement connectors (IDCs) 158. It is anticipated that module 150 could include other, similar format connectors as front jacks 156 and rear IDCs 158. FIG. 29 shows module 150 with faceplate 154 exploded from housing 152, to disclose circuit board 160 to which the front and rear connectors are mounted and opening 162 in faceplate 154 through which front jacks 156 may be accessed.

Figure 30:
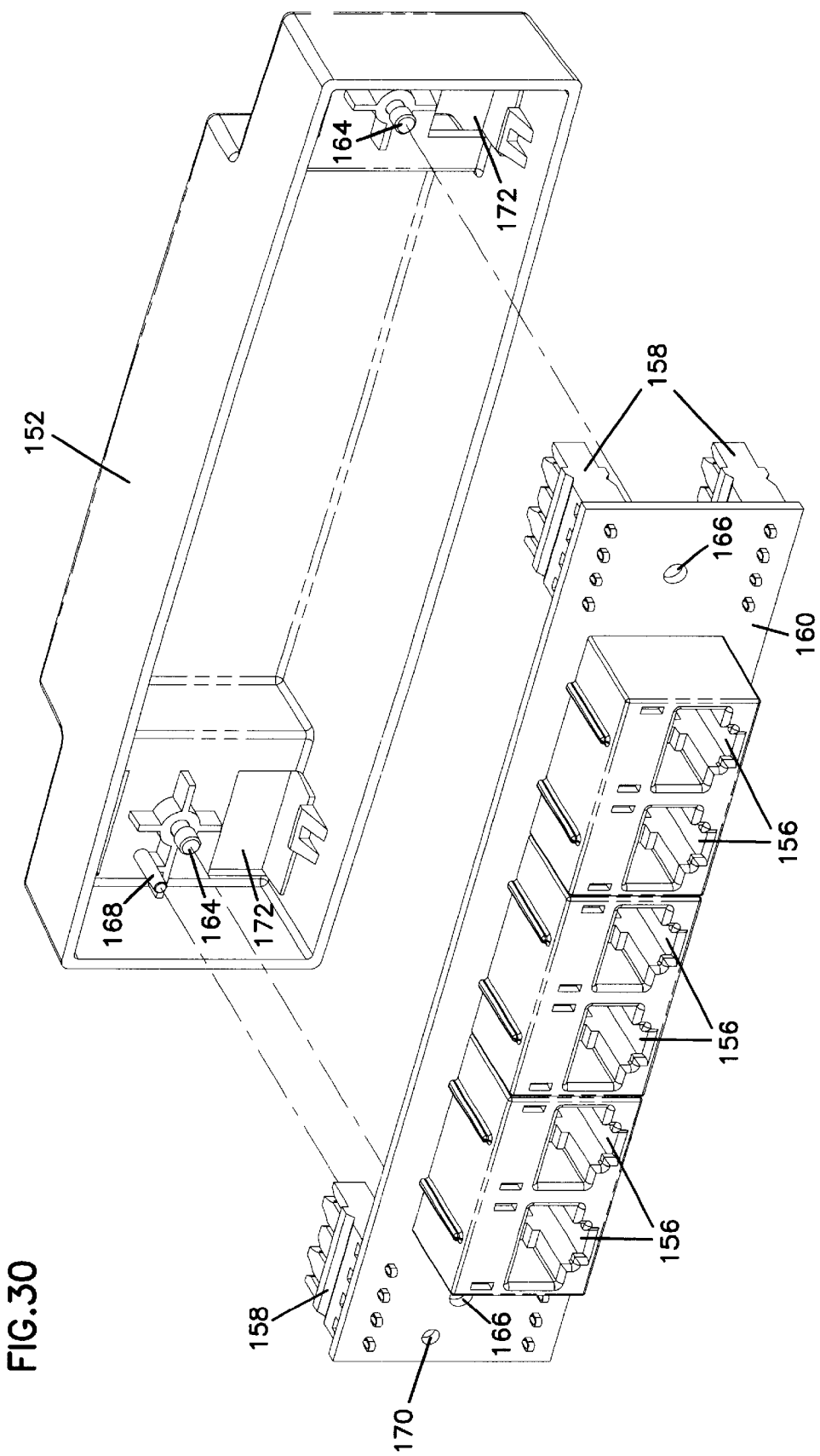
FIG. 30 is a second partially exploded front view of the patch panel of FIG. 27, showing a circuit board with mounted jacks removed from a rear housing.
Figure 31:
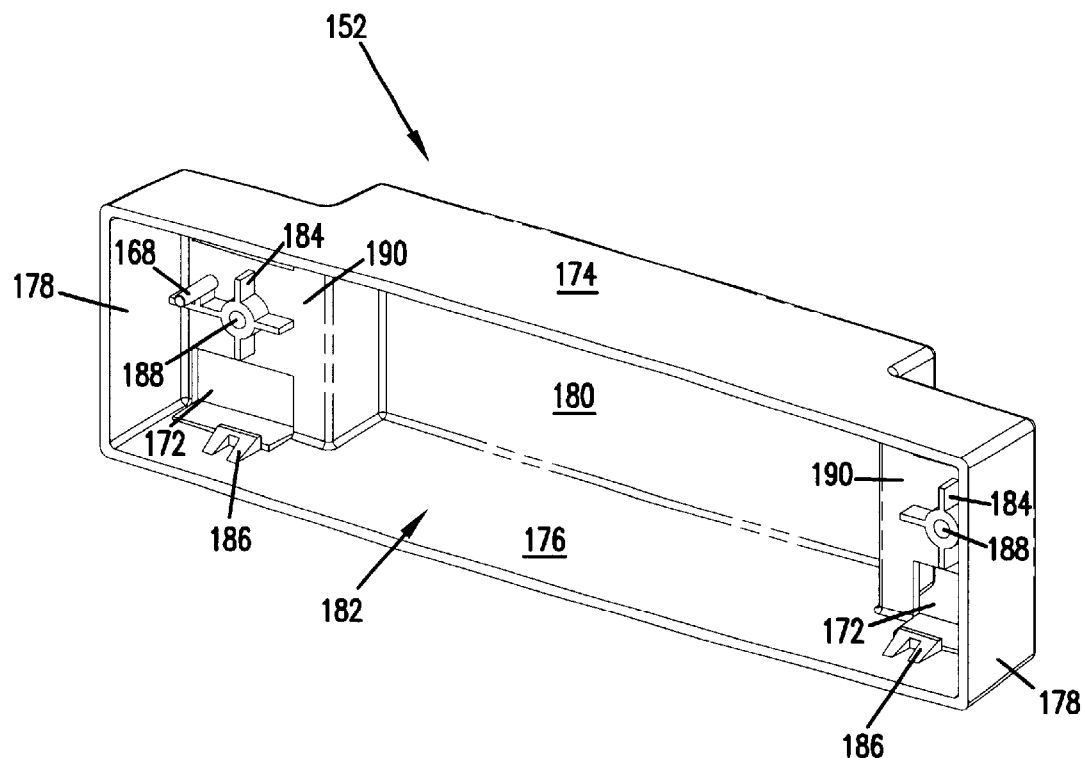
FIG. 31 is a front perspective view of the rear housing of FIG. 30.
Figure 32:
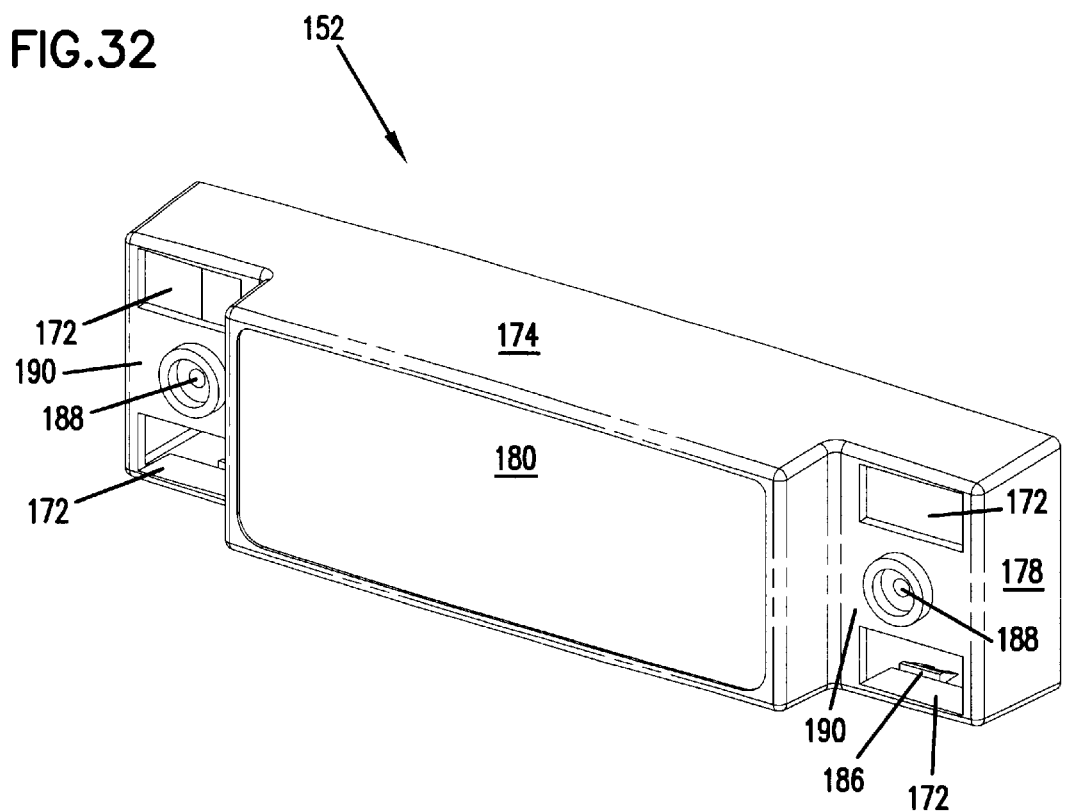
FIG. 32 is a rear perspective view of the rear housing of FIG. 30.
Figure 33:
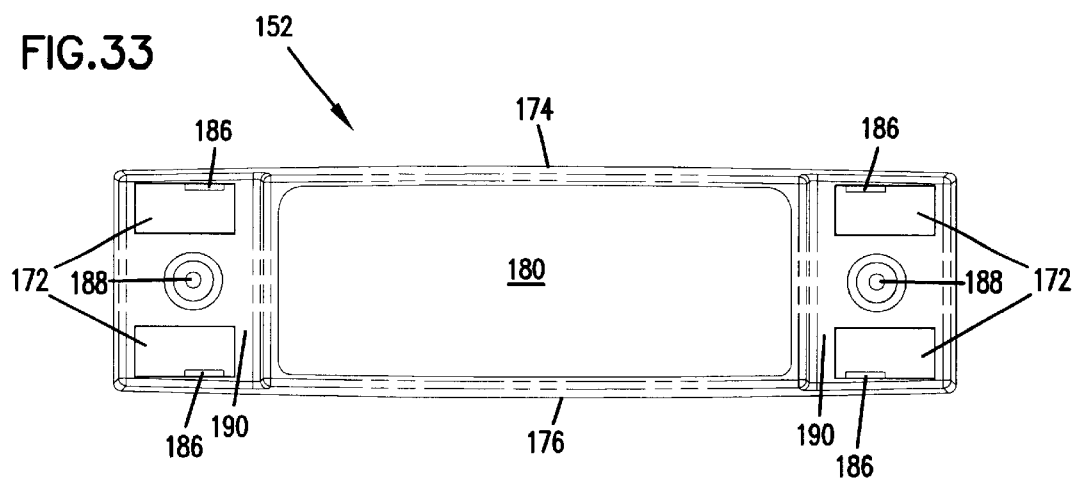
FIG. 33 is a rear view of the rear housing of FIG. 30.
Figure 34:
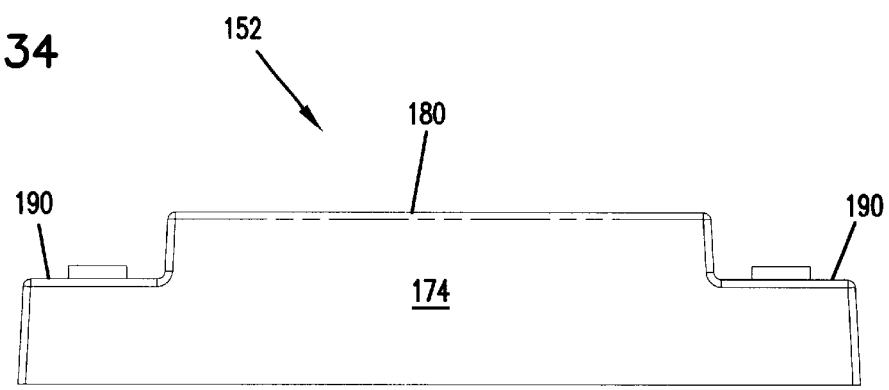
FIG. 34 is a top view of the rear housing of FIG. 30.
Figure 35:
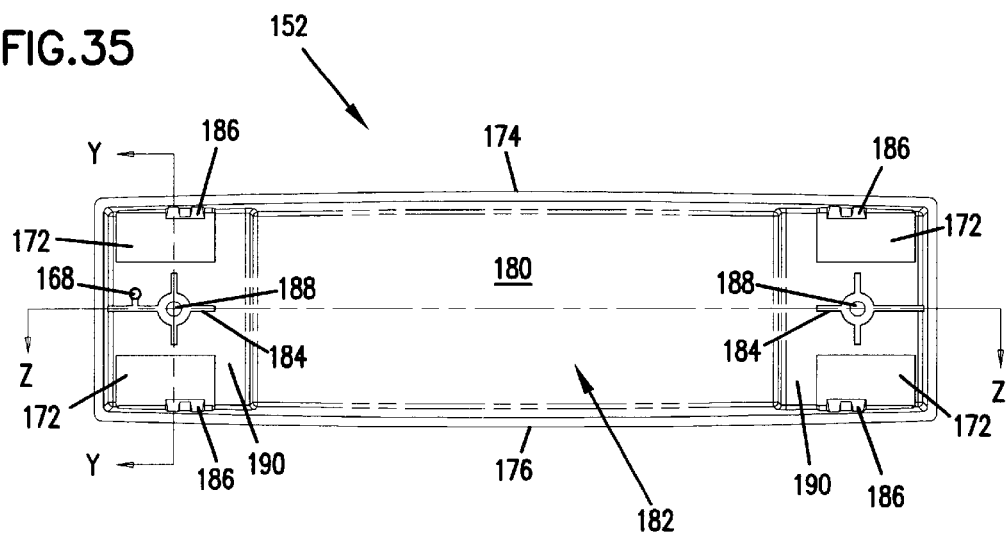
FIG. 35 is a front view of the rear housing of FIG. 30.

Referring now to FIG. 30, showing circuit board 160 exploded from housing 152, removable fasteners such as screws 164 extend through openings 162 in circuit board 160 to secure faceplate 154 to module 150. Alignment pin 168 extends through an alignment opening 170 in circuit board 160 to ensure the correct orientation of circuit board 160 within housing 152. Rear IDCs 158 extend from circuit board 160 through openings 172 in housing 152.

Referring now to FIGS. 31 through 37, additional details of housing 152 to mount and position circuit board 160 are shown. Housing 152 includes a top 174, a bottom 176, opposing sides 178, and a rear wall 180, all of which cooperate to generally define an interior 182 to receive circuit board 160. Secondary rear walls 190 extend generally parallel to rear wall 180 as shown, and include openings 172 for rear IDCs 158, and openings 188 for removable fasteners such as screws 164 which hold faceplate 154 to housing 152. Mounted to secondary rear walls 190 are ribs 184, which cooperate with tabs 186 along top 174 and bottom 176 to define a releasable catch and standoff for holding circuit board 160 within interior 182 so that front jacks 156 and rear IDCs 158 are properly positioned within openings 162 and 172, respectively.

Figure 37:
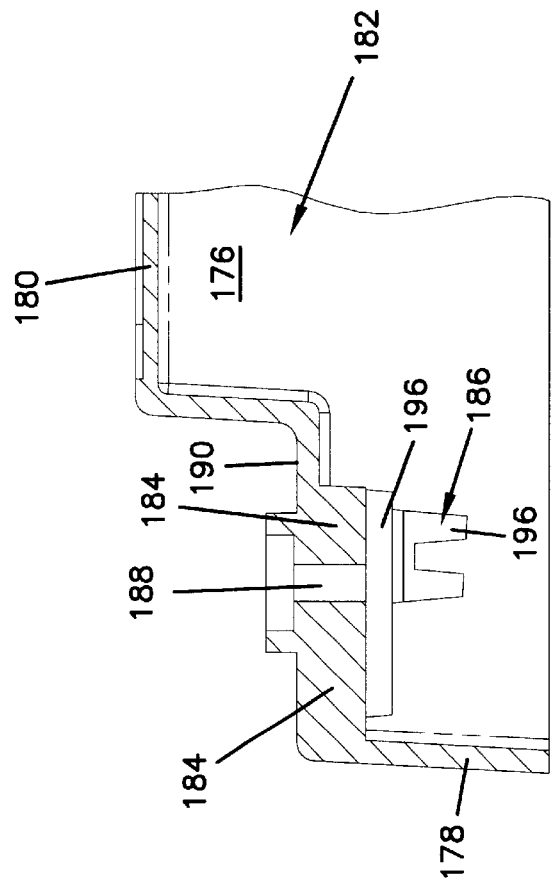
FIG. 37 is a partial cross-sectional view of the rear housing of FIG. 30 taken along line Z—Z as shown in FIG. 35.
Figure 36:
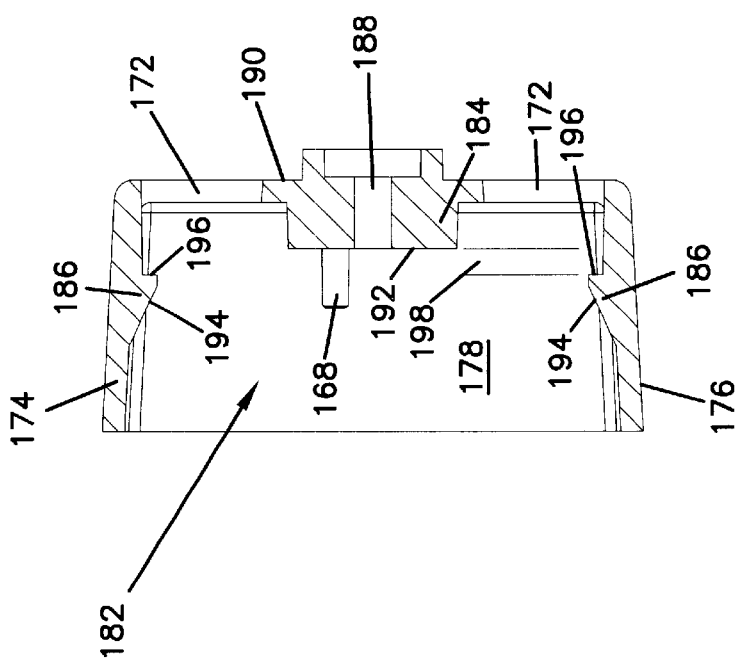
FIG. 36 is a cross-sectional view of the rear housing of FIG. 30 taken along line Y—Y as shown in FIG. 35.

As shown in FIGS. 36 and 37, ribs 184 extend from secondary rear wall 190 into interior 182 and have a surface 192 against which circuit board 160 rests when installed within interior 182. Tabs 186 include ramped surface 194 and locking surface 196. Locking surface 196 and surface 192 cooperate to define a space 198 for receiving and holding circuit board 160 within interior 182. Top 174 and bottom 176 should be made of a deformable resilient material so that circuit board 160 inserted into interior 182 will engage ramped surfaces 194 of tabs 186 and force tabs 186 and top 174 and bottom 176 outward. When tabs 186 have deflected enough to permit circuit board 160 to pass into space 198, tabs 186 and top 174 and bottom 176 return to the positions shown in FIG. 36, so that locking surface 192 traps circuit board 160 in space 198. Circuit board 160 can be released from space 198 by deflecting top 174 and bottom 176 outward sufficiently for locking surface 196 to release circuit board 160, allowing circuit board 160 to be removed from interior 182.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A circuit board comprising:
   a first major side, an opposing second major side, a top edge and a bottom edge;
   a first telecommunications jack mounted on the first major side of the board;
   a second telecommunications jack mounted on the second major side of the board;
   wherein the telecommunications jacks are each eight pin jacks including eight contact springs within each jack, each contact spring electrically connected with a pin;
   wherein the telecommunications jacks are inverted with respect to one another so that the contact springs of the first telecommunications jack are inverted relative to the contact springs of the second telecommunications jack; and
   circuitry on the circuit board electrically connects the pins of the first telecommunications jack with the pins of the second telecommunications jack.

2. The circuit board of claim 1, wherein the telecommunications jacks are RJ-45 jacks.

3. The circuit board of claim 1, wherein the first and second telecommunications jacks are a first pair of telecommunications jacks and at least one additional pair of telecommunications jacks are mounted on the circuit board.

4. The circuit board of claim 1, wherein the circuitry is located on a single layer of the circuit board.

5. The circuit board of claim 1 wherein the circuitry is positioned on a single layer of the circuit board and remains on the same layer from the first telecommunications jack to the second telecommunications jack.

6. The circuit board of claim 1, wherein the circuitry includes multiple circuits and the circuits are positioned on two layers of the circuit board and each circuit remains on the same layer of the circuit board from the first telecommunications jack to the second telecommunications jack.

7. The circuit board of claim 1, wherein the first and second telecommunications jacks are a first pair of telecommunications jacks and at least one more pair is mounted on the circuit board.

8. The circuit board of claim 7, wherein six pairs of telecommunications jacks are mounted to the circuit board.

9. A circuit board comprising:
   a first mounting location for receiving a first telecommunications connector on a first side of the circuit board and a second mounting location for receiving a second telecommunications connector on a second side of the circuit board;
   each mounting location including an array of openings for receiving and electrically connecting with pins extending from a telecommunications connector, the pins electrically connected with conductor springs within the telecommunications connector;
   a plurality of circuits positioned on the circuit board, each circuit electrically connecting an opening in the array of openings of the first mounting location with an opening in the array of openings of the second mounting location;
   each of the circuits positioned on the circuit board with no circuit crossing another circuit, each circuit being paired with another circuit, the circuits in each pair proximate to one another on the circuit board, and each pair of circuits spaced apart from each of the other pairs of circuits.

10. The circuit board of claim 9, wherein each circuit remains on the same layer from the opening in the first mounting location to the opening in the second mounting location.

11. The circuit board of claim 10, wherein each of the arrays of openings has eight openings;
   the openings at the first mounting location arranged into a lower row of four openings numbered sequentially 1, 3, 5 and 7, and an upper row of four openings offset from the lower row and numbered sequentially 2, 4, 6 and 8;
   the openings of the second mounting location arranged into an upper row of four openings numbered sequentially 1, 3, 5 and 7, and a lower row of four openings offset from the upper row and numbered sequentially 2, 4, 6 and 8;
   one of the circuits connecting each numbered opening of the first mounting location with the corresponding numbered opening of the second mounting location; and
   the circuit connecting openings 1 paired with the circuit connecting opening 2, the circuit connecting openings 3 paired with the circuit connecting openings 6, the circuit connecting openings 4 paired with the circuit connecting openings 5, and the circuit connecting openings 7 paired with the circuit connecting openings 8.

12. The circuit board of claim 11, wherein a first telecommunications jack is mounted at the first mounting location and a second telecommunications jack is mounted at the second mounting location.

13. The circuit board of claim 12, wherein the first and second telecommunications jacks are RJ-45 jacks.

14. The circuit board of claim 11, wherein the array of openings at the second mounting location is positioned in a configuration which is a mirror image to a configuration in which the array of openings in the first mounting location is positioned.

15. A circuit board comprising:
   at least two layers for receiving circuits;
   a first mounting location for receiving a first telecommunications connector on a first side of the circuit board and a second mounting location for receiving a second telecommunications connector on a second side of the circuit board;
   each mounting location including an array of openings for receiving and electrically connecting with pins extending from a telecommunications connector, the pins electrically connected with conductor springs within the telecommunications connector;
   a plurality of circuits on the circuit board, each circuit electrically connecting an opening in the array of openings of the first mounting location with an opening in the array of openings of the second mounting location;
   each of the circuits positioned on one of the layers of the circuit board with no circuit crossing another circuit on the same layer, each circuit being paired with another circuit on the same layer, and at least one of the pairs of circuits is located on a layer of the circuit board isolated from the remaining pairs;
   the circuits in each pair proximate to one another on the circuit board, and each pair of circuits spaced apart from other pairs of circuits on the same layer.

16. The circuit board of claim 15, wherein each circuit remains on the same layer from the opening in the first mounting location to the opening in the second mounting location.

17. The circuit board of claim 16, wherein each of the arrays of openings has eight openings;
   the openings at the first mounting location arranged into a lower row of four openings numbered sequentially 1, 3, 5 and 7, and an upper row of four openings offset from the lower row and numbered sequentially 2, 4, 6 and 8;
   the openings of the second mounting location arranged into an upper row of four openings numbered sequentially 1, 3, 5 and 7, and a lower row of four openings offset from the upper row and numbered sequentially 2, 4, 6 and 8;
   one of the circuits connecting each numbered opening of the first mounting location with the corresponding numbered opening of the second mounting location; and
   the circuit connecting openings 1 paired with the circuit connecting opening 2, the circuit connecting openings 3 paired with the circuit connecting openings 6, the circuit connecting openings 4 paired with the circuit connecting openings 5, and the circuit connecting openings 7 paired with the circuit connecting openings 8;

the pair of circuits connecting openings 3 and openings 6 on a first layer of the circuit and the remaining circuit pairs on a second layer of the circuit board.

18. The circuit board of claim 17, wherein an increased amount of mutual capacitance is provided in the circuits connecting openings 3 and openings 6.

19. The circuit board of claim 18, wherein the increased amount of mutual capacitance is provided without the addition of external components to the circuits connecting openings 3 and openings 6.

20. The circuit board of claim 19, wherein the increased amount of mutual capacitance is provided by positioning the circuits connecting openings 3 and openings 6 in an intertwined comb layout.

21. The circuit board of claim 17, wherein the circuits connecting openings 3 and openings 6 each include at least one stub circuit and the remaining circuits are positioned in a generally linear fashion without any stub circuits.

22. The circuit board of claim 21, wherein the stub circuits of the circuits connecting openings 3 and openings 6 cooperate to form an intertwined comb layout.

23. The circuit board of claim 22, wherein a first telecommunications jack is mounted at the first mounting location and a second telecommunications jack is mounted at the second mounting location.

24. The circuit board of claim 23, wherein the first and second telecommunications jacks are RJ-45 jacks.

25. The circuit board of claim 24, wherein the first and second telecommunications jacks are a first pair of jacks and at least one more pair of jacks is mounted on the circuit board.

26. The circuit board of claim 25, wherein six pairs of jacks are mounted on the circuit board.

* * * * *

UNITED STATES PATENT AND TRADEMARK OFFICE
CERTIFICATE OF CORRECTION

PATENT NO. : 6,504,726 B1
DATED : January 7, 2003
INVENTOR(S) : Grabinger et al.

It is certified that error appears in the above-identified patent and that said Letters Patent is hereby corrected as shown below:

<u>Title page,</u>
Item [56], References Cited, U.S. PATENT DOCUMENTS, insert the following references:

| | | |
|---|---|---|
| --4,290,664 | 09/22/1981 | Davis et al. |
| 4,367,908 | 01/11/1983 | Johnston |
| 4,379,609 | 04/12/1983 | Hardesty |
| 4,438,998 | 03/27/1984 | Myers |
| 4,460,234 | 07/17/1984 | Bogese |
| 4,593,966 | 06/10/1986 | Meyer |
| 4,806,117 | 02/21/1989 | Johnston |
| 4,904,209 | 02/27/1990 | Nelson |
| 5,030,123 | 07/09/1991 | Silver |
| 5,074,801 | 12/24/1991 | Siemon |
| 5,139,445 | 08/18/1992 | Below et al. |
| 5,161,988 | 11/10/1992 | Krupka |
| 5,178,554 | 01/12/1993 | Siemon et al. |
| 5,366,388 | 11/22/1994 | Freeman et al. |
| 5,931,703 | 08/03/1999 | Aekins |
| Des. 417,434 | 12/07/1999 | Chang |
| 6,031,909 | 02/29/2000 | Daoud |
| 6,142,834 | 11/07/2000 | Liao |
| 6,146,207 | 11/14/2000 | Mulot-- |

FOREIGN PATENT DOCUMENTS, insert the following references:
-- WO 99/63628   12/19/1999   PCT --
OTHER DOCUMENTS, insert the following references:

--ATS, Inc., "UTP Slim Line™ Adapter Category 5E Products," http://www.atsats.com/products/slim.htm, 3 pages (Printed July 18, 2001).

L-com® Connectivity Products, "L-com ECF Product Literature (excerpts)," 5 pages (Date Unknown).

Ortronics, Inc., "Specialty Panels and Hubs," http://www.ortronics.com/products/products/m_patch_panels, 5 pages (2000).

UNITED STATES PATENT AND TRADEMARK OFFICE
CERTIFICATE OF CORRECTION

PATENT NO. : 6,504,726 B1
DATED : January 7, 2003
INVENTOR(S) : Grabinger et al.

It is certified that error appears in the above-identified patent and that said Letters Patent is hereby corrected as shown below:

Item [56], OTHER DOCUMENTS cont'd,

UNICOM Electric, Inc., "Category 5e and 5 Feed-Thru Panels," http://www.unicomlink.com/wiring/feed.html, 1 page (1995).

Photographs of ATS Slimline$_{TM}$ Adapter EIA T568 A/B PS-Cat 5+, P/N C5RJT155*

"Coupler Assembly, 6 Position, Right Angle," AMP Incorporated, 1 page (July 29, 1984).

ADC Telecommunications, Inc.," Enteraprise™ Structural Connectivity System Patch Panels" 100054PR, December 2000, 21 pgs.

ADC Telecommunications, Inc., "ADC REZ, Home Networking Solutions" 100318PR, September 2000, 2 pages.

ADC Telecommunications, Inc., " Enteraprise™ Network Essentials for ADC" M168, May 2000, 8 pages.

ADC Telecommunications, Inc., "Network Connectivity Solutions" M143, February 2001, Front Cover page, Table of Contents (2 pages), pages 1-41, and Back Cover page.--

Column 7,
Line 9, "...96 and 30 98." should read -- ...96 and 98. --

Signed and Sealed this

Twenty-second Day of July, 2003

JAMES E. ROGAN
*Director of the United States Patent and Trademark Office*